(12) United States Patent
Kim et al.

(10) Patent No.: US 8,093,595 B2
(45) Date of Patent: Jan. 10, 2012

(54) THIN FILM ARRAY PANEL AND MANUFACTURING METHOD THEREOF

(75) Inventors: Sang-Gab Kim, Seoul (KR); Sung-Chul Kang, Yongin-si (KR); Ho-Min Kang, Suwon-si (KR); In-Ho Song, Seoul (KR); Hee-Hwan Choe, Incheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/609,568

(22) Filed: Oct. 30, 2009

(65) Prior Publication Data

US 2010/0047946 A1    Feb. 25, 2010

Related U.S. Application Data

(62) Division of application No. 10/878,529, filed on Jun. 29, 2004, now Pat. No. 7,619,249.

(51) Int. Cl.
   *H01L 29/04* (2006.01)
(52) U.S. Cl. ............ 257/72; 257/57; 257/257; 257/290; 257/E31.083
(58) Field of Classification Search ............ 257/57, 257/72, 257, 290
   See application file for complete search history.

(56) References Cited

U.S. PATENT DOCUMENTS

| | | | |
|---|---|---|---|
| 5,162,933 A * | 11/1992 | Kakuda et al. ........... 349/46 |
| 5,407,710 A | 4/1995 | Baum et al. | |
| 5,784,133 A | 7/1998 | Kim et al. | |
| 6,288,414 B1 | 9/2001 | Ahn | |
| 6,376,861 B1 * | 4/2002 | Yaegashi et al. ........... 257/59 |
| 6,514,804 B1 * | 2/2003 | Yamaguchi ........... 438/164 |
| 6,522,370 B2 | 2/2003 | Takahashi et al. | |
| 6,630,688 B2 | 10/2003 | Kong et al. | |
| 6,714,269 B1 | 3/2004 | Huang | |
| 6,833,883 B2 | 12/2004 | Park et al. | |
| 2002/0140034 A1 | 10/2002 | Ahn et al. | |
| 2003/0007106 A1 | 1/2003 | Sakamoto et al. | |
| 2003/0160920 A1 * | 8/2003 | Ha et al. ........... 349/113 |

FOREIGN PATENT DOCUMENTS

| | | |
|---|---|---|
| JP | 11-233780 | 8/1999 |
| JP | 2001-036095 | 2/2001 |
| JP | 2002-148659 | 5/2002 |
| JP | 2002-246607 | 8/2002 |
| JP | 2002-328629 | 11/2002 |
| JP | 2003-068755 | 3/2003 |
| KR | 1020020002655 | 1/2002 |
| KR | 1020020003224 | 1/2002 |

\* cited by examiner

*Primary Examiner* — Wai-Sing Louie
(74) *Attorney, Agent, or Firm* — F. Chau & Associates, LLC

(57) ABSTRACT

A method of manufacturing a thin film array panel is provided, which includes: forming a gate line formed on a substrate; forming a gate insulating layer on the gate line; forming a semiconductor layer on the gate insulating layer; forming an ohmic contact layer on the semiconductor layer; forming a data line and a drain electrode disposed at least on the ohmic contact layer, forming an oxide on the data line; etching the ohmic contact layer using the data line and the drain electrode as an etch mask; and forming a pixel electrode connected to the drain electrode.

13 Claims, 30 Drawing Sheets

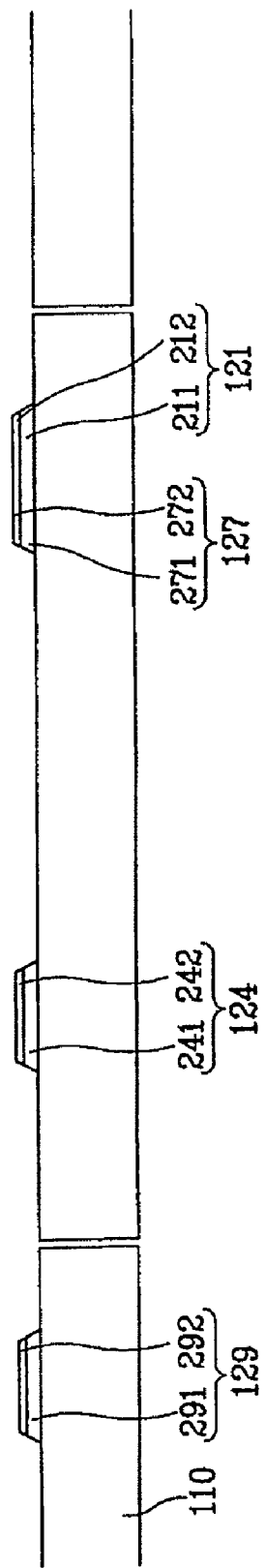

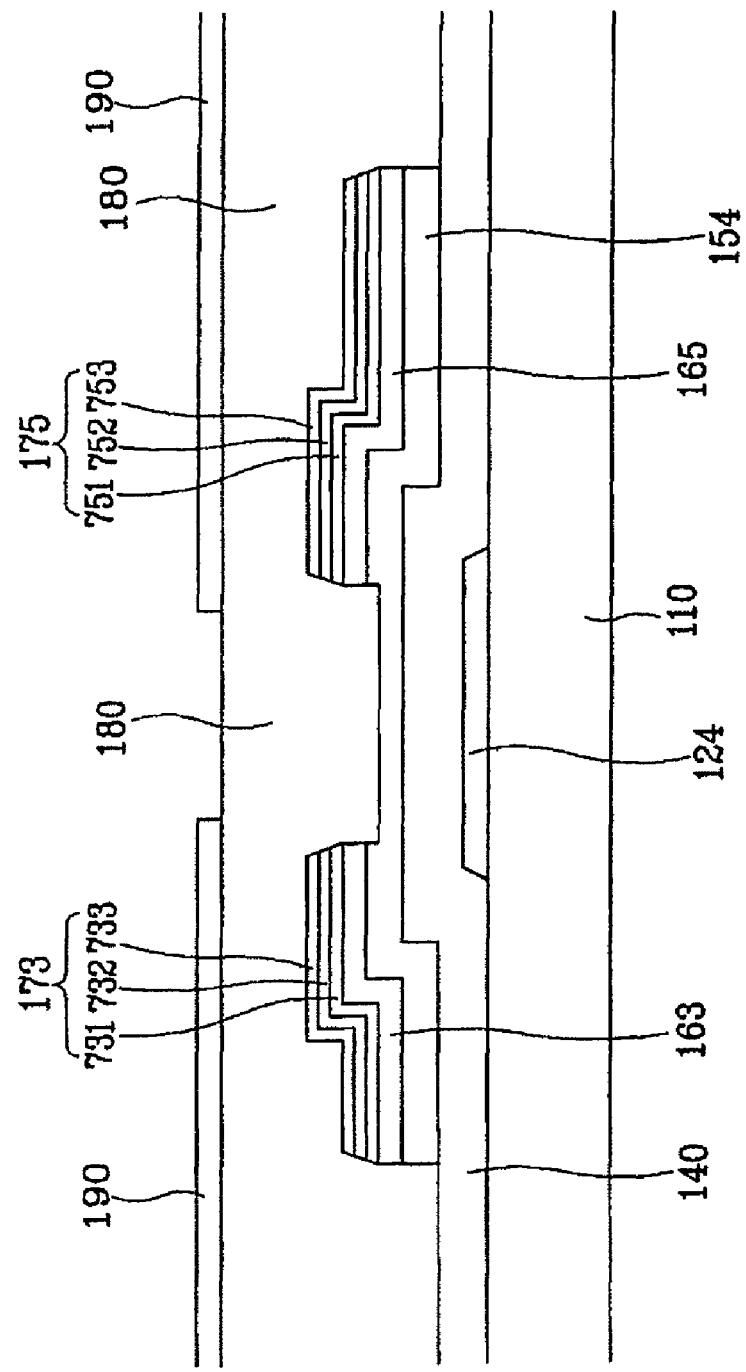

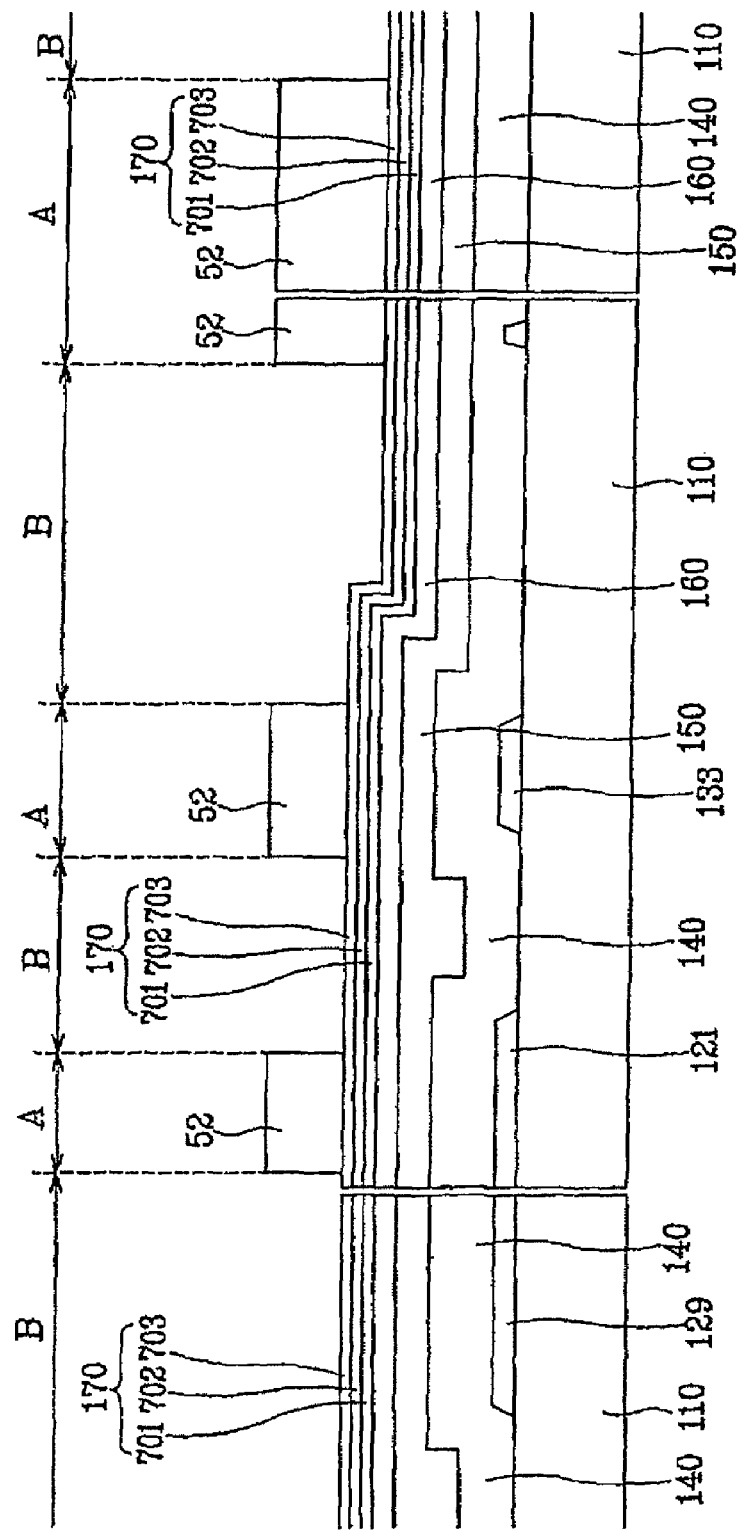

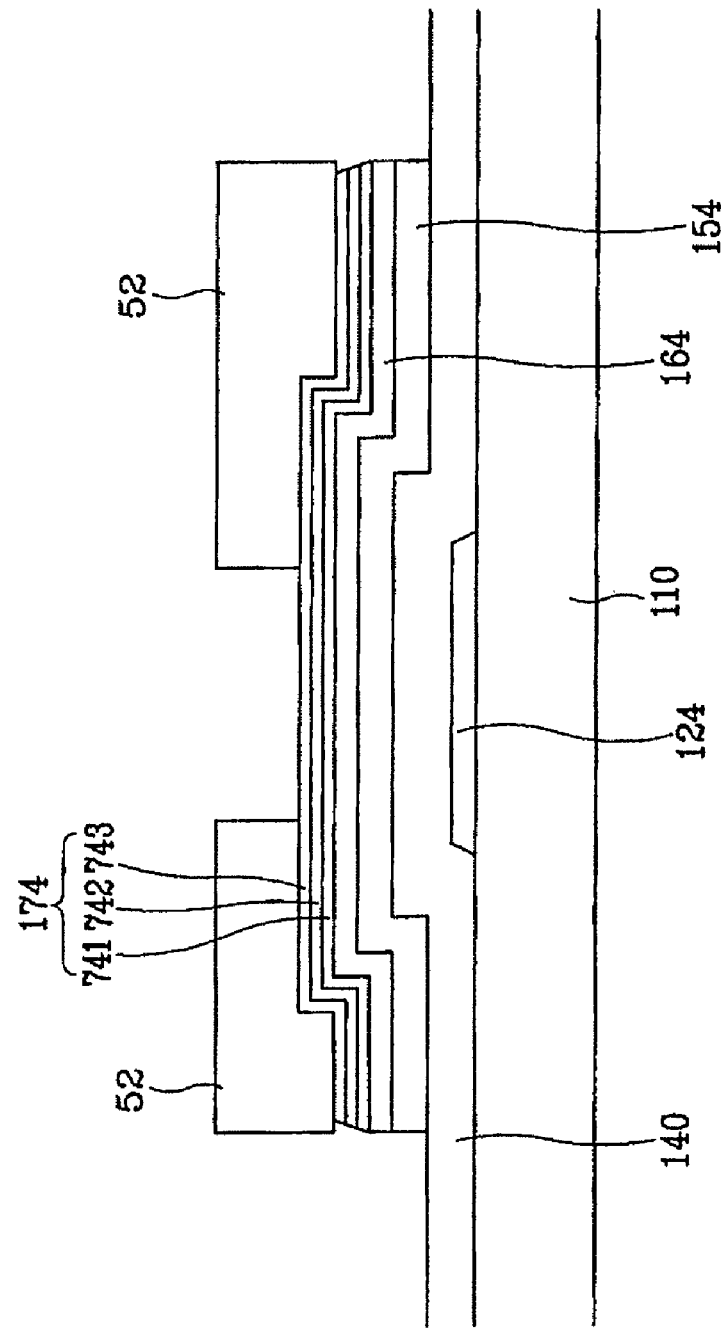

THIN FILM ARRAY PANEL AND MANUFACTURING METHOD THEREOF

This application is a Divisional Application of U.S. patent application Ser. No. 10/878,529 filed on Jun. 29, 2004 now U.S. Pat. No. 7,619,249, which claims priority to Korean Patent Application No. 10-2003-43596, filed on Jun. 30, 2003, the disclosures of which are incorporated by reference herein in their entireties.

BACKGROUND OF THE INVENTION (a) Field of the Invention

The present invention relates to a thin film array panel and a manufacturing method thereof.

(b) Description of the Related Art

Generally, a thin film array panel is used for display devices such as liquid crystal displays (LCDs) and organic light emitting displays (OLED).

The LCD is one of the most widely used flat panel displays since it is lightweight and occupies less space than conventional cathode ray tube (CRT) displays. The general structure of an LCD consists of a liquid crystal (LC) layer that is positioned between a pair of panels including field generating electrodes and polarizers. The LC layer is subjected to an electric field generated by the electrodes and variations in the field strength change the molecular orientation of the LC layer. For example, upon application of an electric field, the molecules of the LC layer change their orientation to change the polarization of light passing through the LC layer. Appropriately positioned polarizing filters selectively block the polarized light, creating dark areas that can represent desired images.

The thin film array panel for display device generally includes a plurality of pixel electrodes, a plurality of thin film transistors (TFTs) for controlling signals to be applied to the pixel electrodes, and a plurality of signal lines transmitting the signals.

The signal lines are made of low resistivity material such as Al or Al alloy and the signal lines contacting semiconductor further include a refractory metal film. However, since Al containing metal has poor physical and chemical characteristics, several methods for compensating the weak characteristics are suggested. One of the methods is to anodize the Al containing metal. Another example is to add a compensating conductor made of indium tin oxide (ITO) or indium zinc oxide (IZO), which is used for pixel electrodes, on the Al containing metal. However, the contact between the Al containing metal and ITO and IZO is poor, another metal is required to be disposed between the Al containing metal and the compensating conductor.

Mo or Mo alloy is suggested to be a substitute for Al containing metal since it has low resistivity and good contact characteristics with ITO or IZO. However, the Mo containing metal has poor chemical resistance and thus it may be easily corroded under a chemically active circumference such as when another film or layer is being etched.

SUMMARY OF THE INVENTION

A motivation of the present invention is to solve the problems of the conventional art.

A method of manufacturing a thin film array panel is provided, which includes: forming a gate line formed on a substrate; forming a gate insulating layer on the gate line; forming a semiconductor layer on the gate insulating layer; forming an ohmic contact layer on the semiconductor layer; forming a data line and a drain electrode disposed at least on the ohmic contact layer; forming an oxide on the data line; etching the ohmic contact layer using the data line and the drain electrode as an etch mask; and forming a pixel electrode connected to the drain electrode.

The formation of the oxide may include: performing oxygen plasma treatment on the data line and the drain electrode.

The oxygen plasma treatment may be performed for a time longer than about fifteen seconds.

The data line and the drain electrode may include a first film of Mo or Mo alloy and may further include a second film of Al or Al alloy.

The method may further include: performing ashing after the formation of the oxide.

The formation of the oxide may include: exposing the data line and the drain electrode to air.

The pixel electrode may include ITO or IZO and the ohmic contact layer may include extrinsic amorphous silicon.

The semiconductor layer, the ohmic contact layer, and the drain electrode and the data line may be formed by using a single photoresist pattern.

A thin film array panel is provided, which includes: a substrate; a gate conductor formed on the substrate and including a gate electrode; a gate insulating layer formed on the gate line; a semiconductor layer formed on the gate insulating layer; a data conductor including a source electrode and a drain electrode formed at least on the ohmic contact layer; an oxide film formed on the data conductor; and a pixel electrode connected to the drain electrode.

The data conductor may include a Mo containing metal film and it may further include an Al containing metal film.

The data conductor may include a pair of Mo containing metal films and an Al containing metal film interposed between the Mo containing films.

The semiconductor layer may have substantially the same planar shape as the data conductor except for a portion between the source electrode and the drain electrode.

The thin film array panel may further include a passivation layer disposed between the data conductor and the pixel electrode.

The oxide film may have a thickness of about 10-20 Å.

BRIEF DESCRIPTION OF THE DRAWINGS

The present invention will become more apparent by describing embodiments thereof in detail with reference to the accompanying drawings in which:

FIGS. 3B, 4B, 5B and 6B are sectional views of the TFT array panel shown in FIGS. 3A, 4A, 5A and 6A taken along the lines IIIB-IIIB', IVB-IVB', VB-VB', and VIB-VIB', respectively;

FIGS. 8 and 9 are sectional views of the TFT array panel shown in FIG. 7 taken along the line VIII-VIII' and the line IX-IX', respectively;

FIGS. 12B and 12C are sectional views of the TFT array panel shown in FIG. 12A taken along the lines XIIIB-XIIIB' and XIIC-XIIC', respectively;

FIGS. 13A, 14A and 15A and FIGS. 13B, 14B and 15B are sectional views of the TFT array panel shown in FIG. 12A taken along the lines XIIIB-XIIIB' and XIIC-XIIC', respectively, which illustrate the step following the step shown in FIGS. 10B and 10C;

DETAILED DESCRIPTION OF EMBODIMENTS

Figure 1:
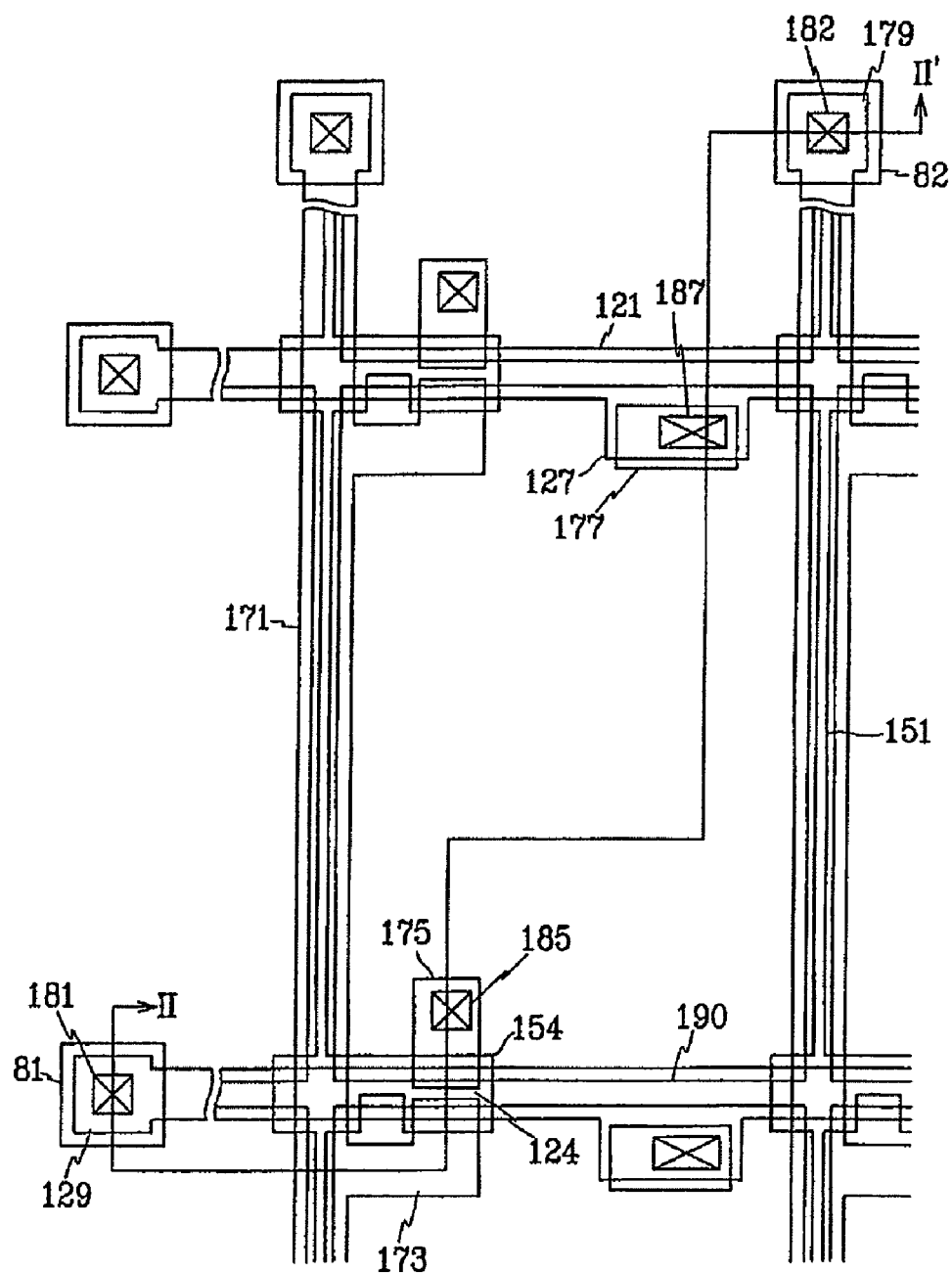
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1 and 2.

Figure 2:
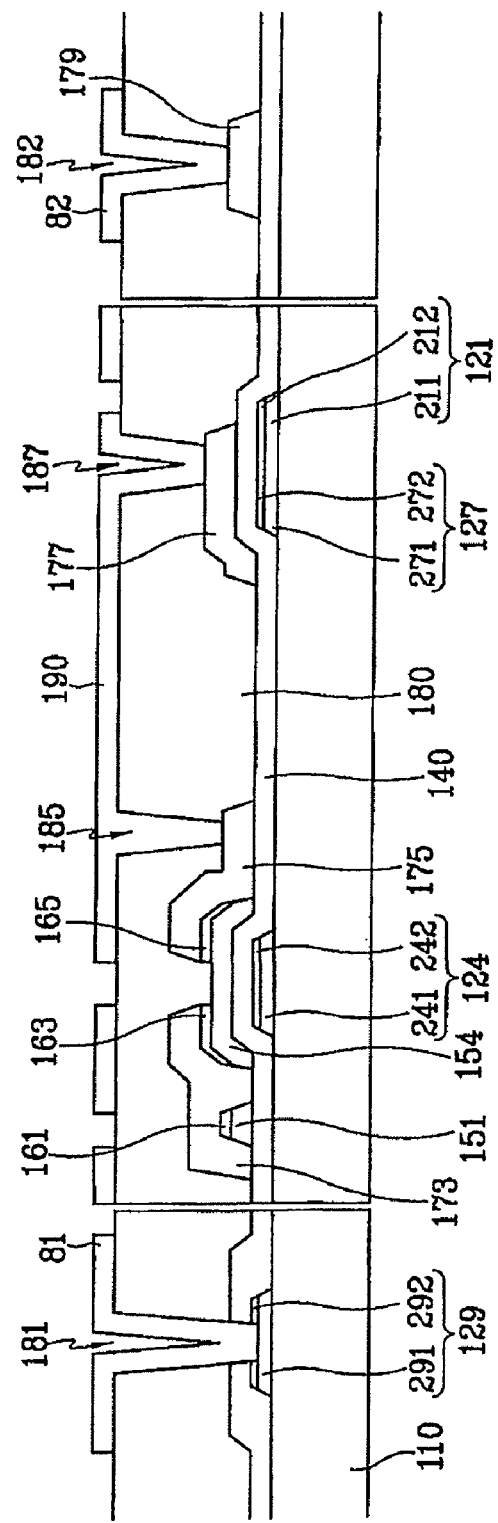
FIG. 2 is a sectional view of the TFT array panel shown in FIG. 1 taken along the line II-II'.

FIG. 1 is an exemplary layout view of a TFT array panel according to an embodiment of the present invention, and FIG. 2 is a sectional view of the TFT array panel shown in FIG. 1 taken along the line II-II'.

A plurality of gate lines 121 for transmitting gate signals are formed on an insulating substrate 110. Each gate line 121 extends substantially in a transverse direction and a plurality of portions of each gate line 121 form a plurality of gate electrodes 124. Each gate line 121 includes a plurality of projections 127 protruding downward and an expanded end portion 129 having a large area for contact with another layer or an external device.

The gate lines 121 include two films having different physical characteristics, a lower film 211 and an upper film 212. The upper film 211 is preferably made of low resistivity metal including Al containing metal such as Al and Al alloy for reducing signal delay or voltage drop in the gate lines 121. On the other hand, the lower film 212 is preferably made of material such as Cr, Mo, Mo alloy, Ta and Ti, which has good physical, chemical, and electrical contact characteristics with other materials such as indium tin oxide (ITO) and indium zinc oxide (IZO). A good exemplary combination of the lower film material and the upper film material is Cr and Al—Nd alloy. In FIG. 2, the lower and the upper films of the gate electrodes 124 are indicated by reference numerals 241 and 242, respectively, the lower and the upper films of the projections 127 are indicated by reference numerals 271 and 272, respectively, and the lower and the upper films of the end portions 129 are indicated by reference numerals 291 and 292, respectively. Portions of the upper film 292 of the end portions 129 of the gate lines 121 are removed to expose the underlying portions of the lower films 291.

However, the gate lines 121 may include a single layer preferably made of Al containing metal, Ag containing metal such as Ag and Ag alloy, Cu containing metal such as Cu and Cu alloy, Cr, Mo, Mo alloy, Ta, or Ti. Alternatively, the gate lines 121 may have a multi-layered structure.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range between about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the storage capacitor conductors 177 are preferably made of Mo or Mo alloy. They may include an upper film preferably made of Mo or Mo alloy and a lower film located thereon and preferably made of Al containing metal. Alternatively, the data lines 171, etc., include triple layers interposing a middle layer of Mo or Mo alloy.

Like the gate lines 121, the data lines 171, the drain electrodes 175, and the storage capacitor conductors 177 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain to electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, the storage electrode capacitors 177, and exposed portions of the semiconductor stripes 151, which are not covered with the data lines 171 and the drain electrodes 175. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide. The passivation layer 180 may have a double-layered structure including a lower inorganic film and an upper organic film.

The passivation layer 180 has a plurality of contact holes 182, 185 and 187 exposing the end portions 179 of the data lines 171, the drain electrodes 175, and the storage conductors 177, respectively. The passivation layer 180 and the gate insulating layer 140 have a plurality of contact holes 181 exposing the lower film 291 of the end portions 129 of the gate lines 121. It is preferable that the contact holes 181, 182, 185 and 187 do not expose Al containing metal, and if they expose Al containing metal, the Al containing metal is preferably removed by blanket etch.

A plurality of pixel electrodes 190 and a plurality of contact assistants 81 and 82, which are preferably made of ITO or IZO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 overlap the gate lines 121 and the data lines 171 to increase aperture ratio but it is optional.

The contact assistants 81 and 82 are connected to the exposed expansions 129 of the gate lines 121 and the exposed expansions 179 of the data lines 171 through the contact holes 181 and 182, respectively. The contact assistants 81 and 82 protect the exposed portions 129 and 179 and complement the adhesion between the exposed portions 129 and 179 and external devices.

According to another embodiment of the present invention, the pixel electrodes 190 are made of transparent conductive polymer. For a reflective LCD, the pixel electrodes 190 are made of opaque reflective metal. In these cases, the contact assistants 81 and 82 may be made of material such as ITO or IZO different from the pixel electrodes 190.

A method of manufacturing the TFT array panel shown in FIGS. 1 and 2 according to an embodiment of the present invention will be now described in detail with reference to FIGS. 3A to 6B as well as FIGS. 1 and 2.

FIGS. 3A, 4A, 5A and 6A are layout views of the TFT array panel shown in FIGS. 1 and 2 in intermediate steps of a manufacturing method thereof according to an embodiment of the present invention, and FIGS. 3B, 4B, 5B and 6B are sectional views of the TFT array panel shown in FIGS. 3A, 4A, 5A and 6A taken along the lines IIIB-IIIB', IVB-IVB', VB-VB' and VIB-VIB', respectively.

Two conductive films, a lower conductive film and an upper conductive film are sputtered in sequence on an insulating substrate 110 such as transparent glass. The lower conductive film is preferably made of a metal such as Cr, Mo, and Mo alloy, which has good contact characteristics with ITO or IZO, and it has a thickness of about 500 Å. The upper conductive film is preferably made of Al containing metal and preferably has a thickness of about 2,500 Å.

Figure 3A:
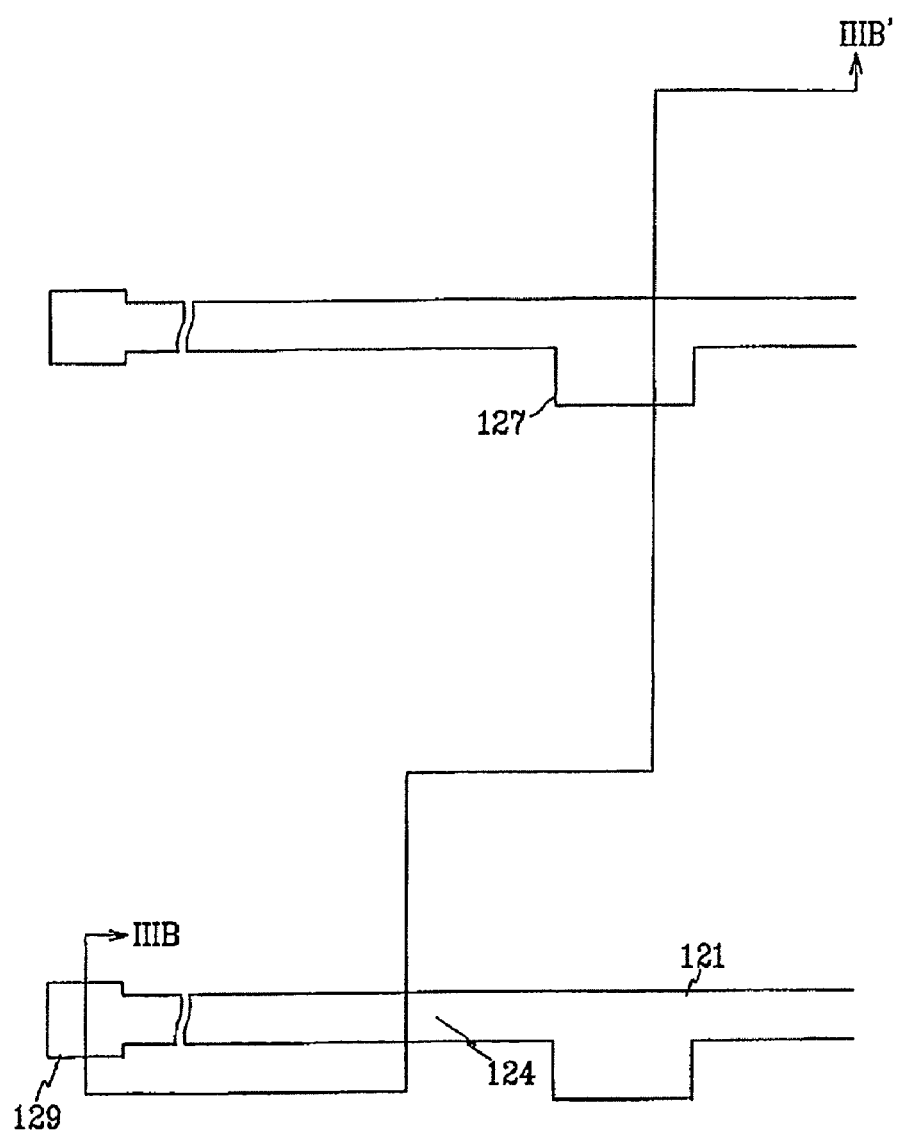
FIGS. 3A, 4A, 5A and 6A are layout views of the TFT array panel shown in FIGS. 1 and 2 in intermediate steps of a manufacturing method thereof according to an embodiment of the present invention.

Referring to FIGS. 3A and 3B, the upper conductive film and the lower conductive film are patterned in sequence by photo-etching with a photoresist pattern to form a plurality of gate lines 121 including a plurality of gate electrodes 124 and a plurality of projections 127. Although the lower and the upper films 211 and 212 may be separately etched under different conditions, they may be simultaneously etched preferably using an Al etchant including 8-15% $CH_3COOH$, 5-8% $HNO_3$, 50-60% $H_3PO_3$, and remaining $H_2O$, which can etch both Al and Mo with giving inclined etch profiles.

Figure 4A:
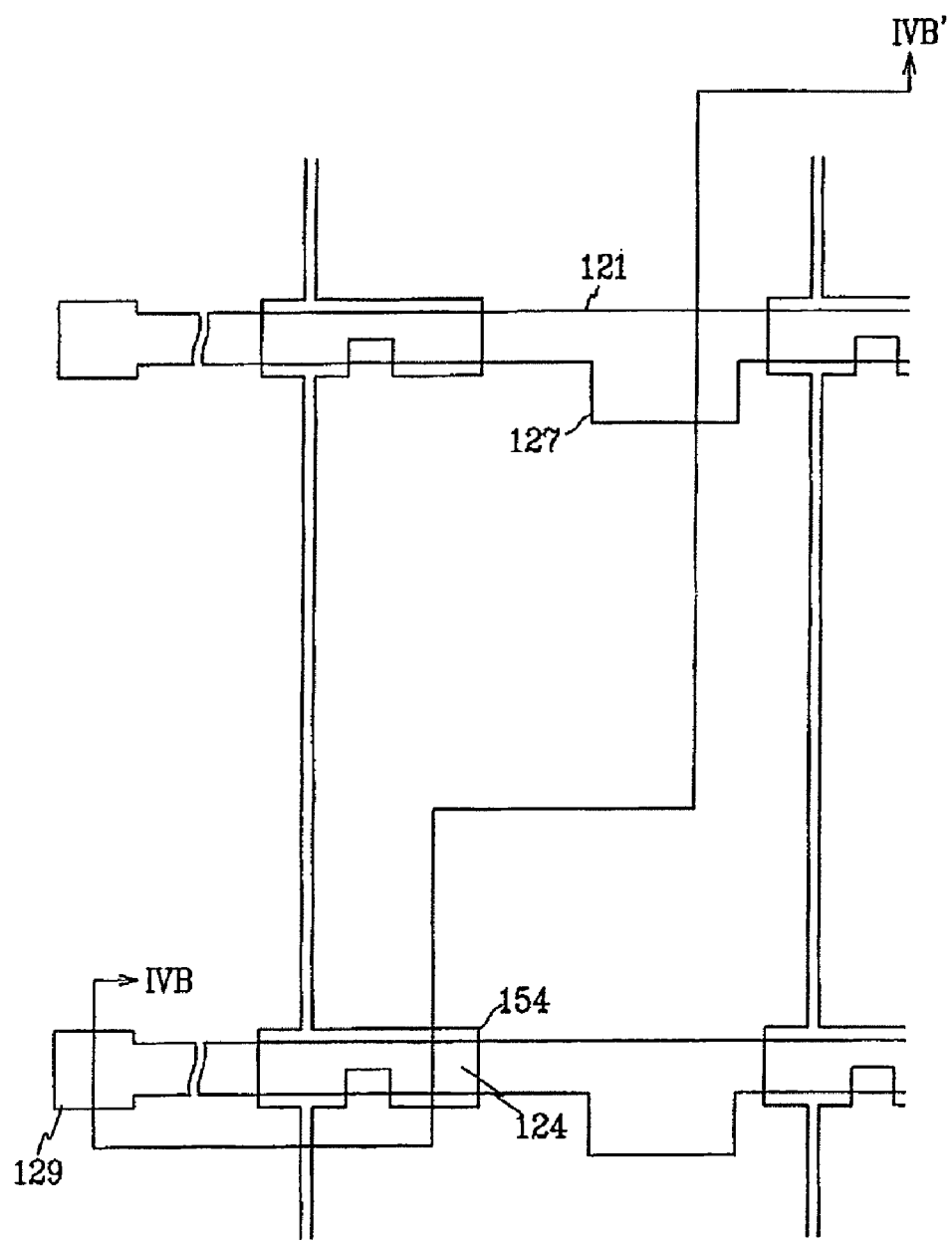
Figure 4B:
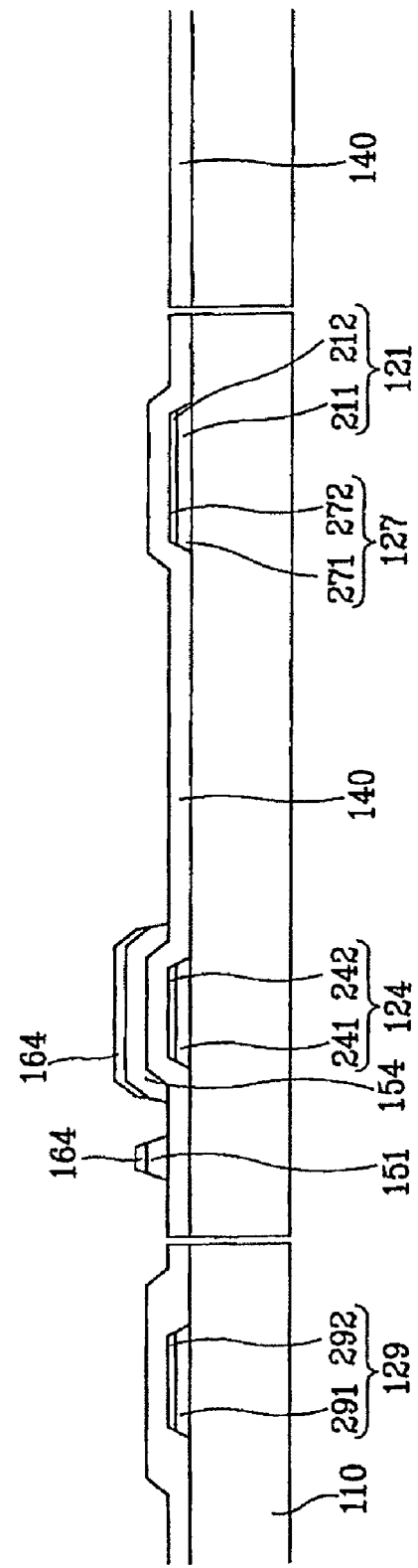

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range between about 250° C. and about 500° C.

Figure 5A:
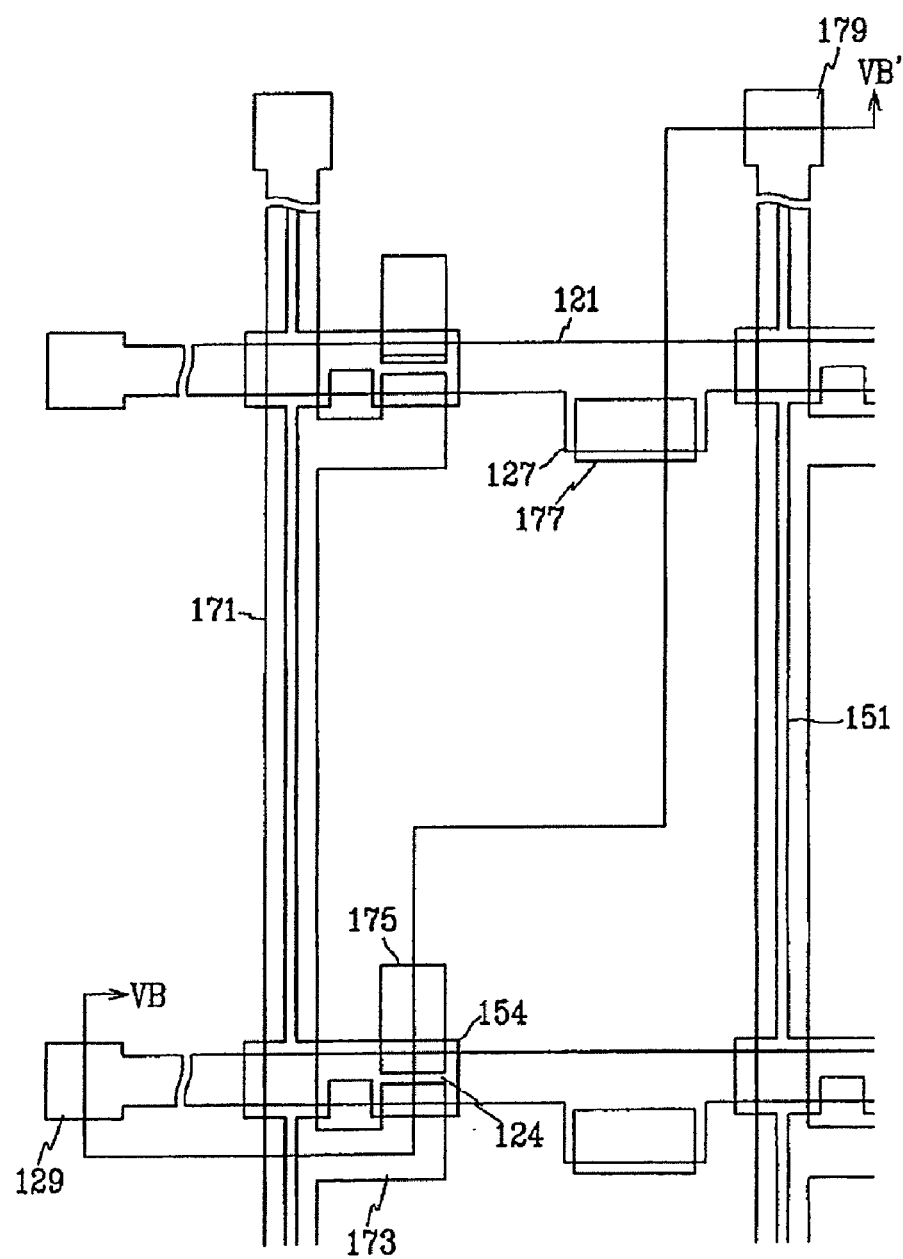
Figure 5B:
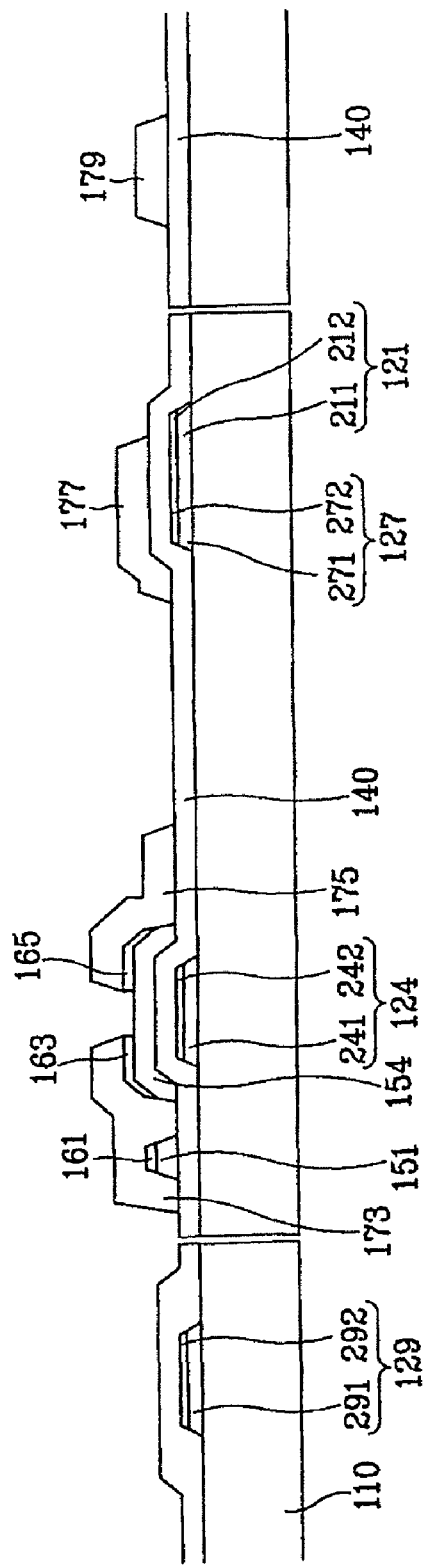

Referring to FIGS. 5A and 5B, a conductive layer is sputtered and etched using a photoresist film (not shown) to form a plurality of data lines 171 including a plurality of source electrodes 173, a plurality of drain electrodes 175, and a plurality of storage capacitor conductors 177.

Before or after removing the photoresist film, portions of the extrinsic semiconductor stripes 164, which are not covered with the data lines 171, the drain electrodes 175, and the storage capacitor conductors 177, are removed by etch to complete a plurality of ohmic contact stripes 161 including a plurality of projections 163 and a plurality of ohmic contact islands 165 and to expose portions of the intrinsic semiconductor stripes 151. In case that the exposed portions of the extrinsic semiconductor stripes 164 is removed using the data lines 171, the drain electrodes 175, and the storage capacitor conductors 177 as an etch mask after removing the photoresist film, the extrinsic semiconductor stripes 164 are dry etched preferably using $CF_4$+HCl in order to prevent the damage on the Mo containing films of the data lines 171, etc.

In addition, the Mo containing films are preferably oxidized to form an oxide film (not shown) thereon having a small thickness of about 10-20 Å since the Mo containing film may have a poor chemical resistance against $CF_4$+HCl to be etched and the etched particles are deposited on the exposed portions of the intrinsic semiconductor stripes 151 to deteriorate the characteristics of TFTs. The oxidization may be performed by oxygen plasma for a time longer than fifteen seconds and an ashing step may be added after forming the oxide. Otherwise, the substrate 110 may be exposed to air for the oxidation.

According to an experiment, the etch of the exposed portions of the extrinsic semiconductor stripes 164 after forming the oxides removed portions of the Mo film by only a small thickness of about 50 Å, thereby obtaining uniform reproductivity.

Oxygen plasma treatment may follow thereafter in order to stabilize the exposed surfaces of the semiconductor stripes 151.

Figure 6A:
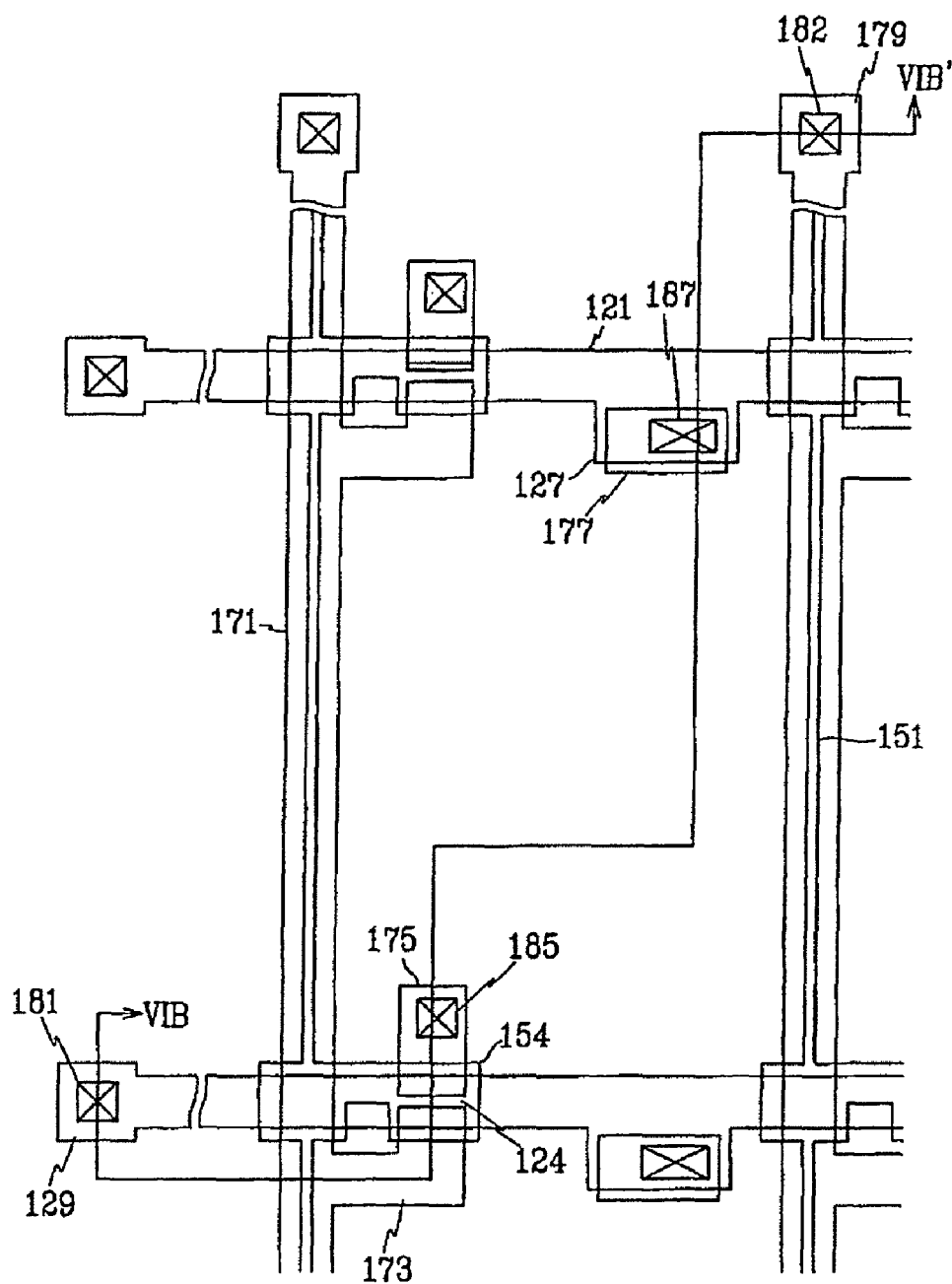
Figure 6B:
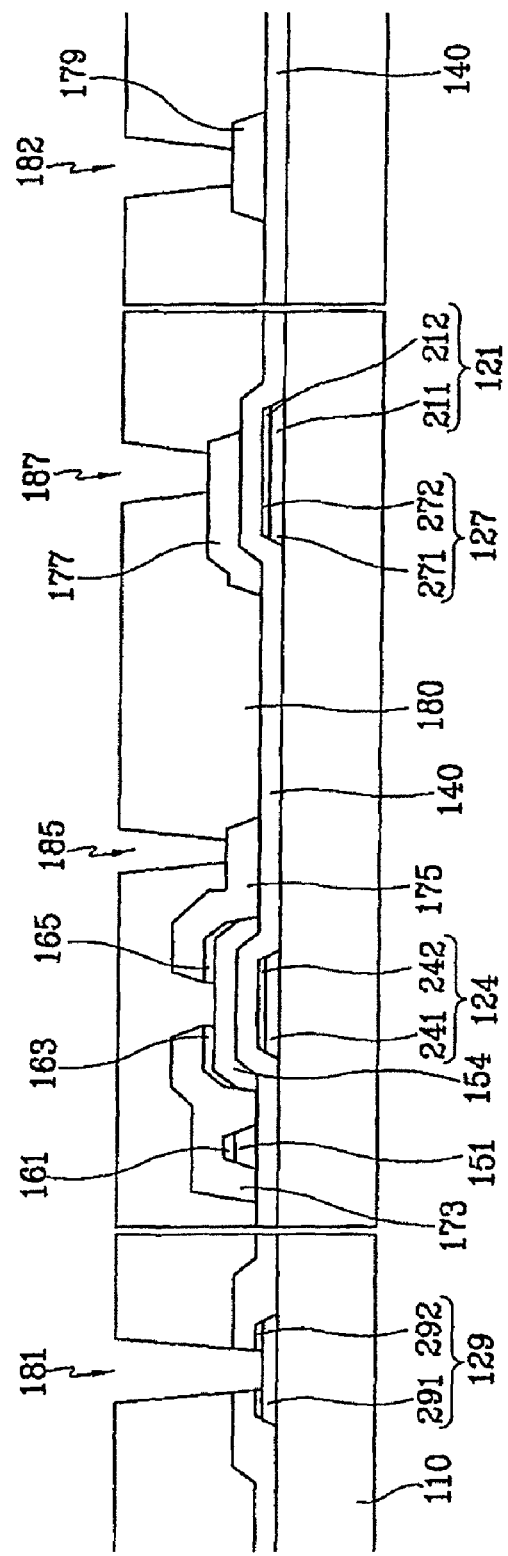

Referring to FIGS. 6A and 6B, a passivation layer 180 is deposited and dry etched along with the gate insulating layer 140 to form a plurality of contact holes 181, 182, 185 and 187 exposing the end portions 129 of the gate lines 121, the end portions 179 of the data lines 171, the drain electrodes 175, and the storage capacitor conductors 177. The exposed portions of the oxides on the end portions 179 of the data lines 171, the drain electrodes 175, and the storage capacitor conductors 177 through the contact holes 182, 185 and 187 may be removed in this step.

Finally, as shown in FIGS. 1 and 2, a plurality of pixel electrodes 190 and a plurality of contact assistants 81 and 82 are formed on the second passivation layer 802 by sputtering and photo-etching an ITO or IZO layer.

A TFT array panel for an LCD according to another embodiment of the present invention will be described in detail with reference to FIGS. 7-9.

Figure 7:
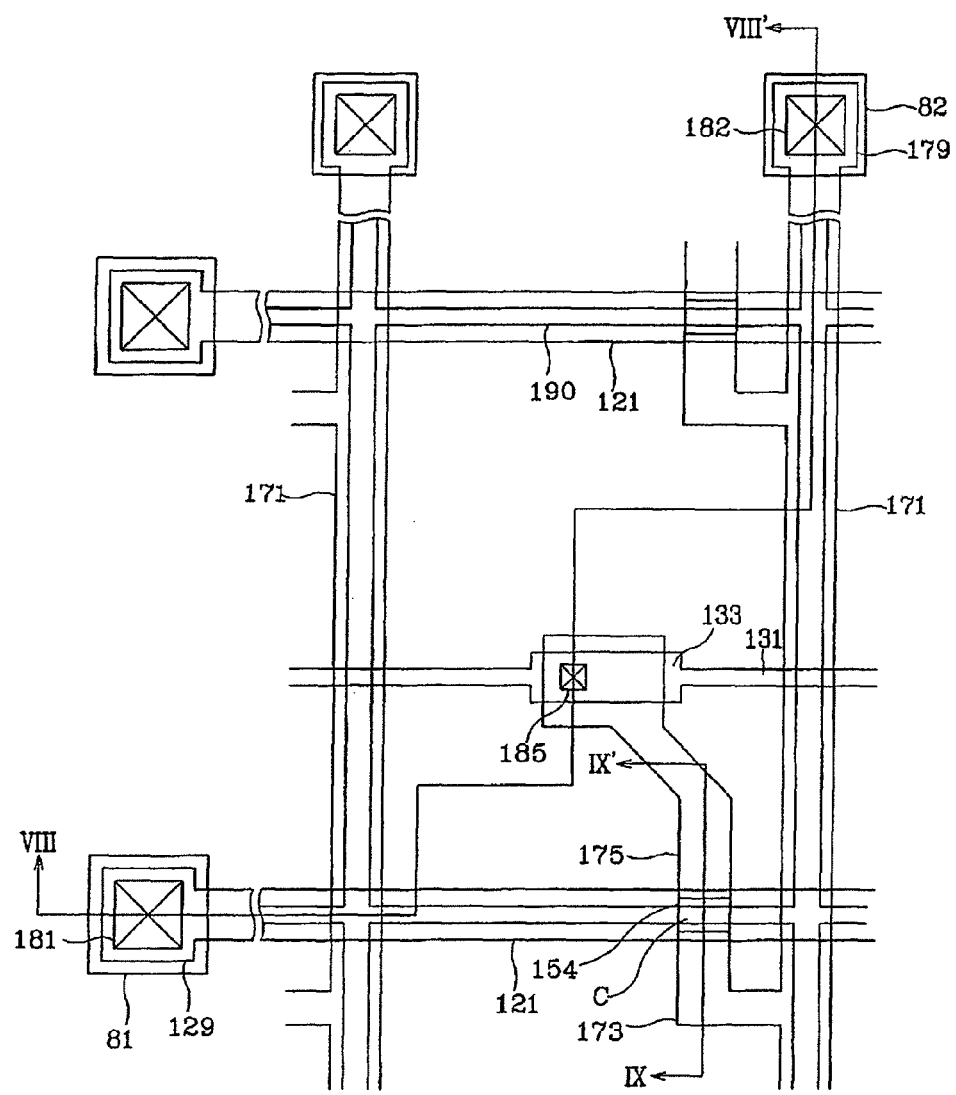
FIG. 7 is a layout view of an exemplary TFT array panel for an LCD according to another embodiment of the present invention.
Figure 8:
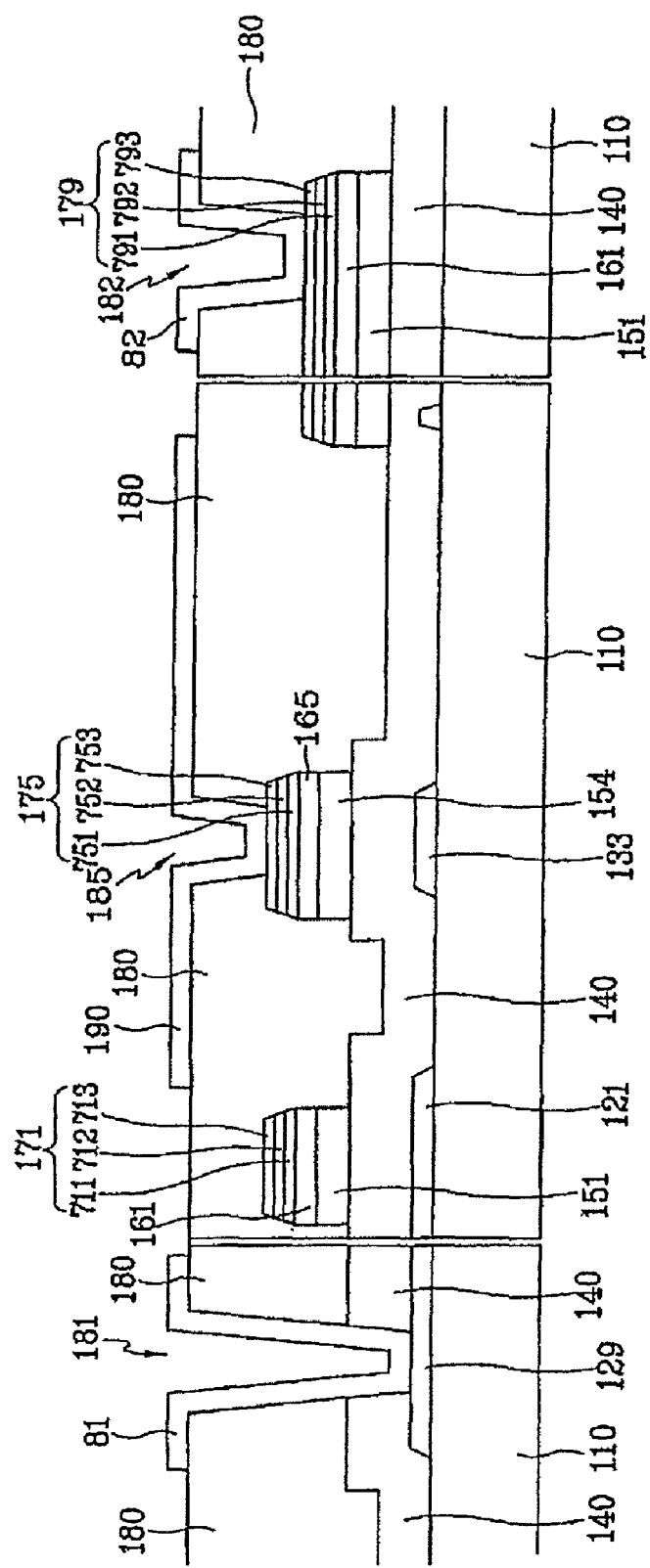

FIG. 7 is a layout view of a TFT array panel for an LCD according to another embodiment of the present invention, FIG. 8 is a sectional view of the TFT array panel shown in FIG. 7 taken along the line VIII-VIII', and FIG. 9 is a sectional view of the TFT array panel shown in FIG. 7 taken along the lines IX-IX'.

Referring to FIGS. 7-9, a layered structure of the TFT array panel according to this embodiment are almost the same as those shown in FIGS. 1 and 2.

That is, a plurality of gate lines 121 including a plurality of gate electrodes 124 and a plurality of storage electrode lines 131 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 are formed thereon. A plurality of contact holes 181, 182 and 185 are provided at the passivation layer 180 and the gate insulating layer 140, and a plurality of pixel electrodes 190 and a plurality of contact assistants 81 and 82 are formed on the passivation layer 180.

Different from the TFT array panel shown in FIGS. 1 and 2, the TFT array panel according to this embodiment provides a plurality of storage electrode lines 131, which are separated from the gate lines 121, on the same layer as the gate lines 121 without providing projections at the gate lines 121. The storage electrode lines 131 are supplied with a predetermined voltage such as the common voltage and they have a lower film 311 and an upper film 312. Without providing the storage capacitor conductors 177 shown in FIGS. 1 and 2, the storage electrode lines 131 includes a plurality of storage electrodes 133 having a large area and the drain electrodes 175 extend to overlap the storage electrodes 133 to form storage capacitors. The storage electrode lines 131 may be omitted if the storage capacitance generated by the overlapping of the gate lines 121 and the pixel electrodes 191 is sufficient. The storage electrode lines 131 may be disposed near the gate lines 121 to increase the aperture ratio.

In addition, the semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Furthermore, the data lines 171 and the drain electrodes 175 have a triple-layered structure including a lower film 711 and 751 preferably made of Mo containing metal, an intermediate film 712 and 752 preferably made of Al containing metal, and an upper film 713 and 153 preferably made of Mo containing metal. In FIGS. 8 and 9, the lower, intermediate, and upper films of the source electrodes 173 are indicated by reference numerals 731, 732 and 734, respectively, and the lower, intermediate, and upper films of end portions 179 of the data lines 171 are indicated by reference numerals 791, 792 and 793, respectively.

Moreover, the gate lines 121 and the storage electrode lines 131 have a single layer structure.

Many of the above-described features of the TFT array panel for an LCD shown in FIGS. 1 and 2 may be appropriate to the TFT array panel shown in FIGS. 7-9.

Now, a method of manufacturing the TFT array panel shown in FIGS. 7-9 according to an embodiment of the present invention will be described in detail with reference to FIGS. 10A-16C as well as FIGS. 7-9.

Figure 10A:
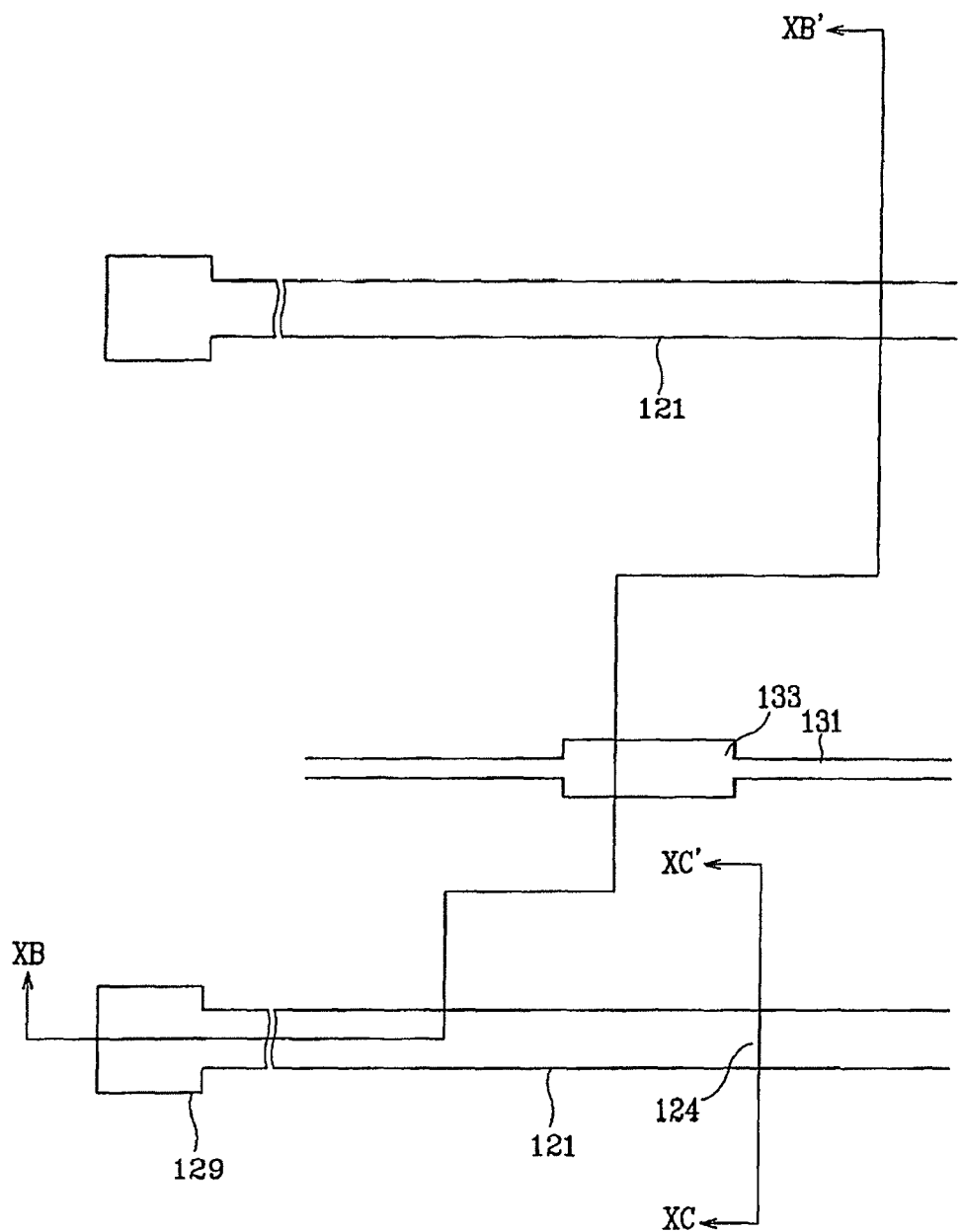
FIG. 10A is a layout view of a TFT array panel shown in FIGS. 7-9 in the first step of a manufacturing method thereof according to an embodiment of the present invention.
Figure 10B:
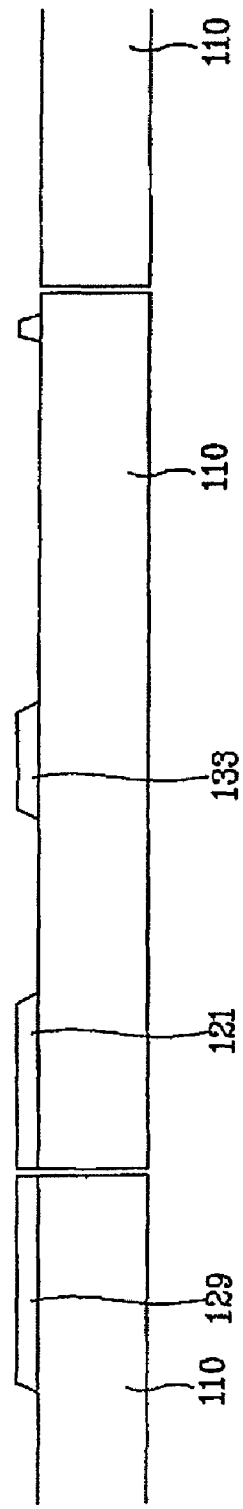
FIGS. 10B and 10C are sectional views of the TFT array panel shown in FIG. 10A taken along the lines XB-XB' and XC-XC', respectively.
Figure 10C:
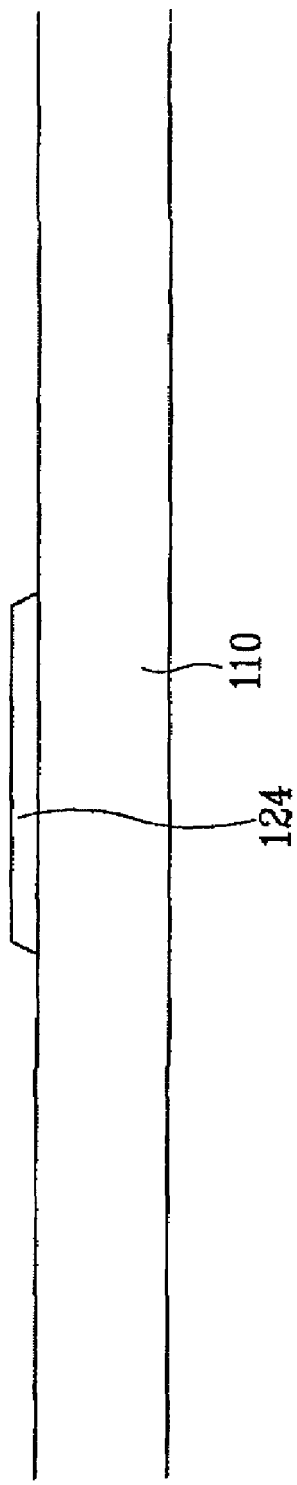
Figure 11A:
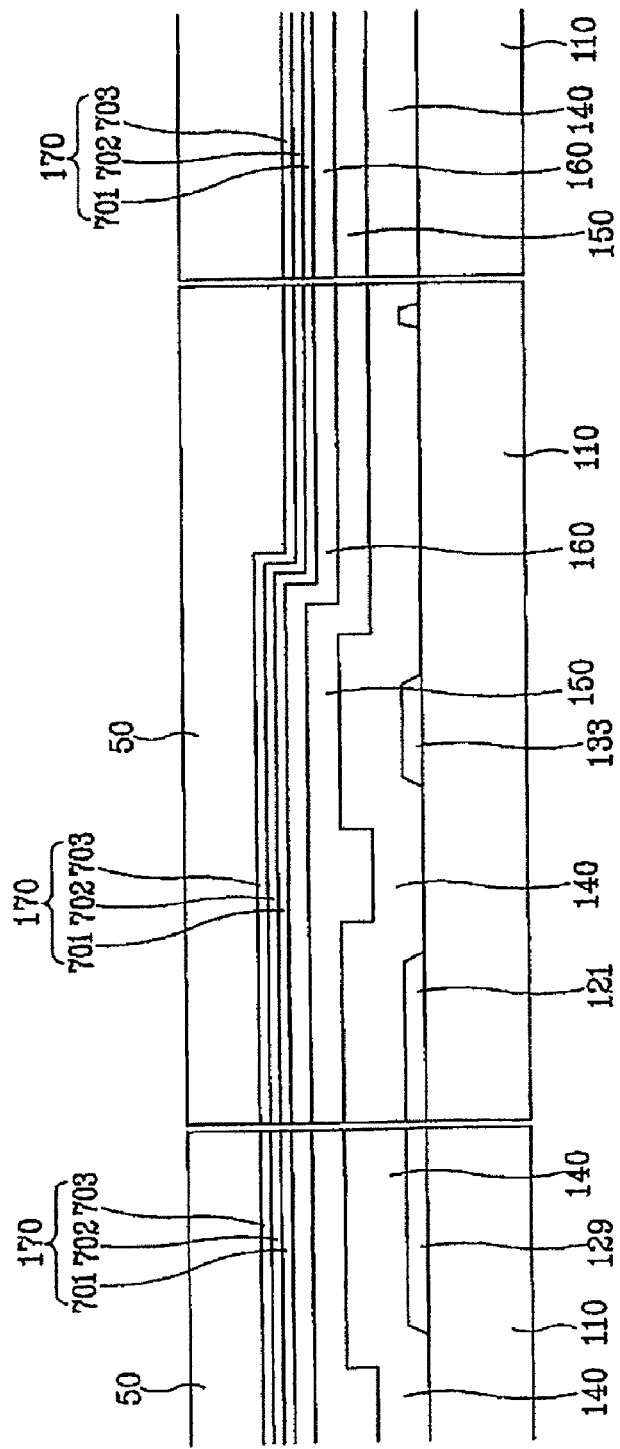
FIGS. 11A and 11B are sectional views of the TFT array panel shown in FIG. 10A taken along the lines XB-XB' and XC-XC', respectively, and illustrate the step following the step shown in FIGS. 10B and 10C.
Figure 11B:
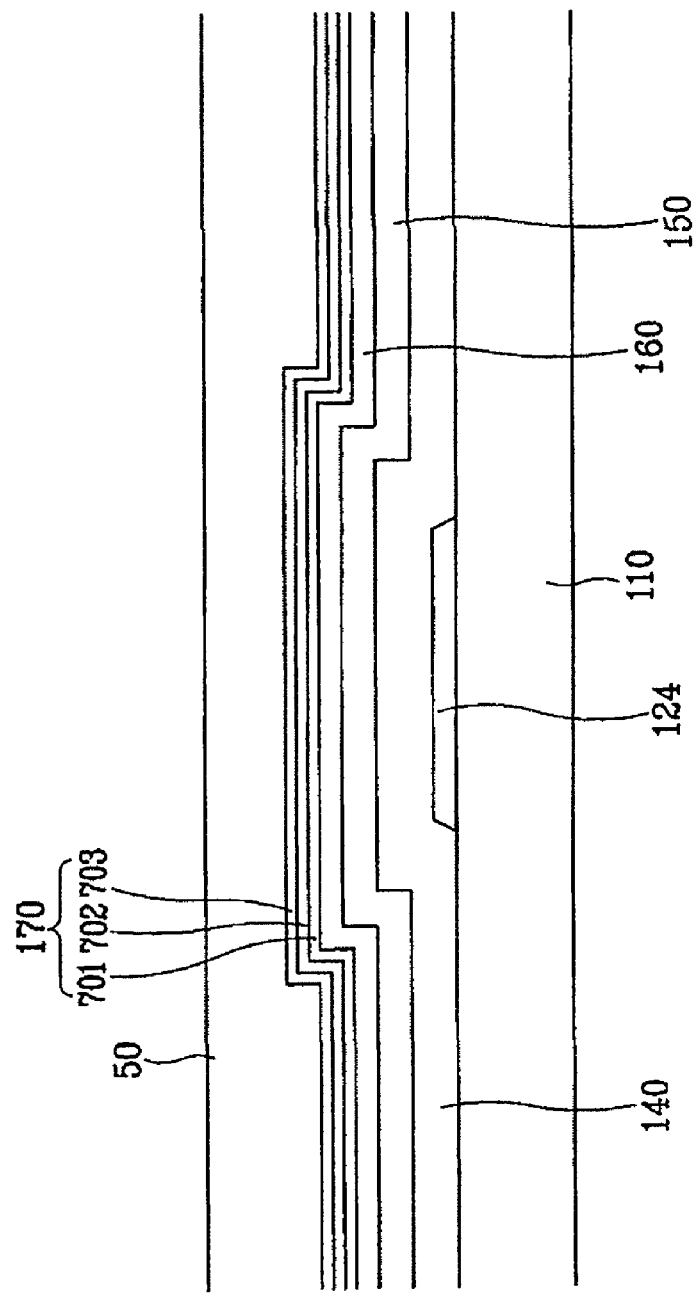
Figure 12A:
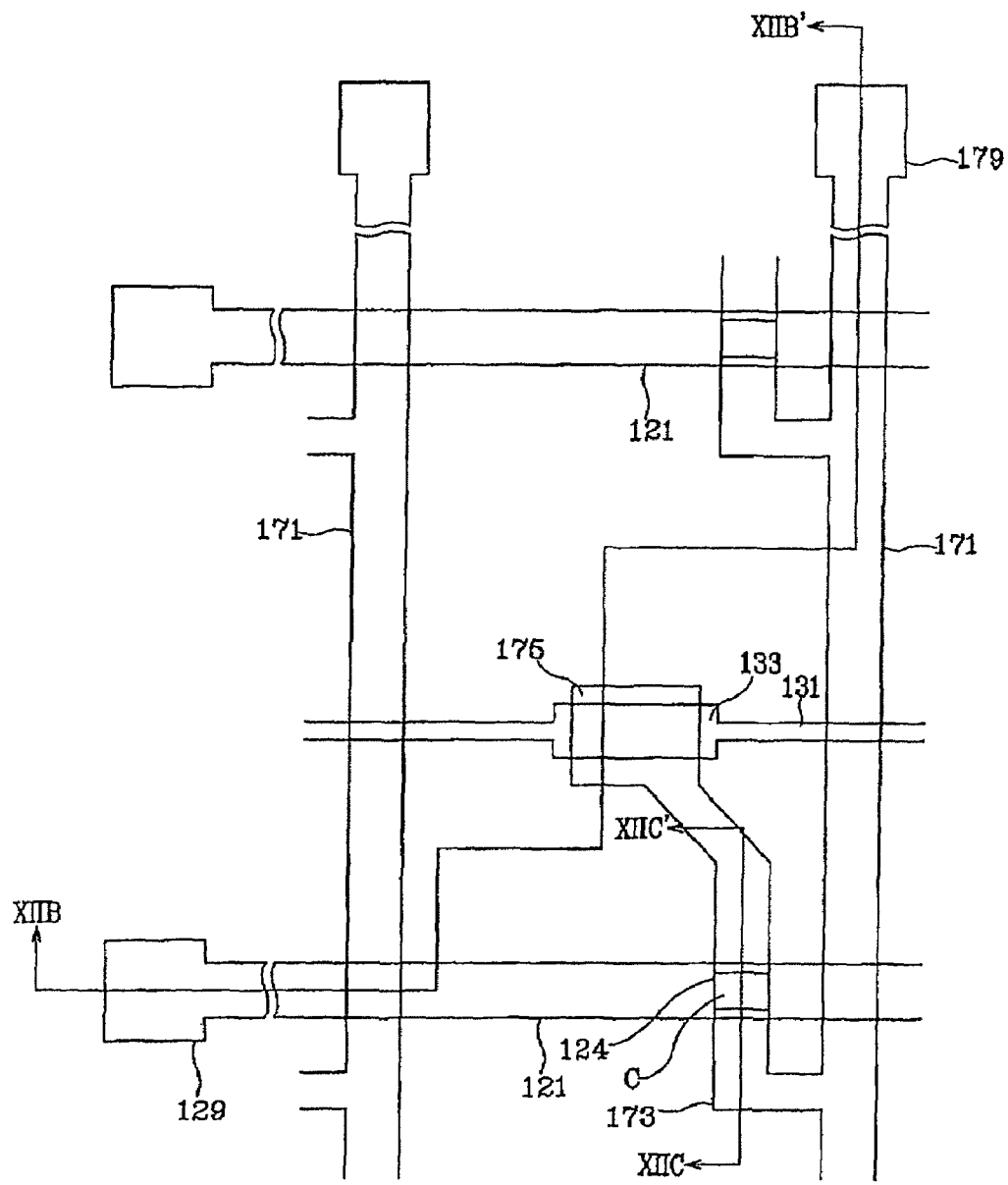
FIG. 12A is a layout view of the TFT array panel in the step following the step shown in FIGS. 11A and 11B.
Figure 12C:
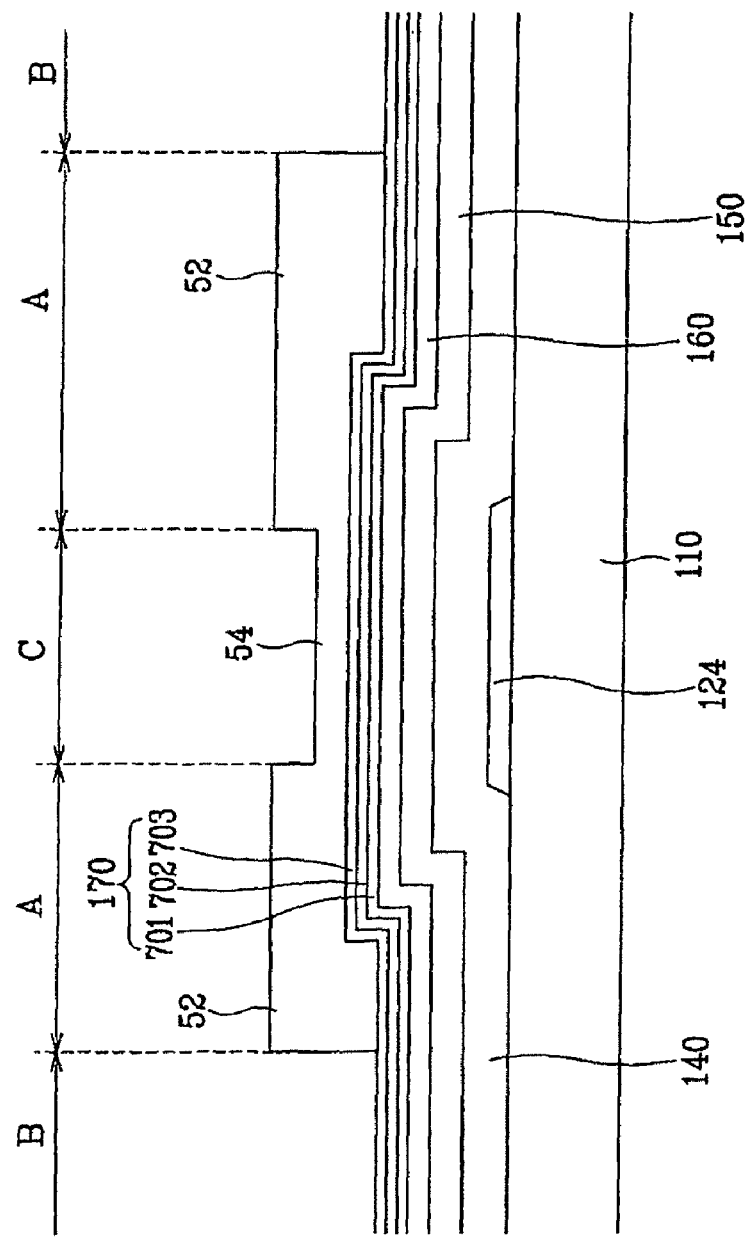
Figure 15A:
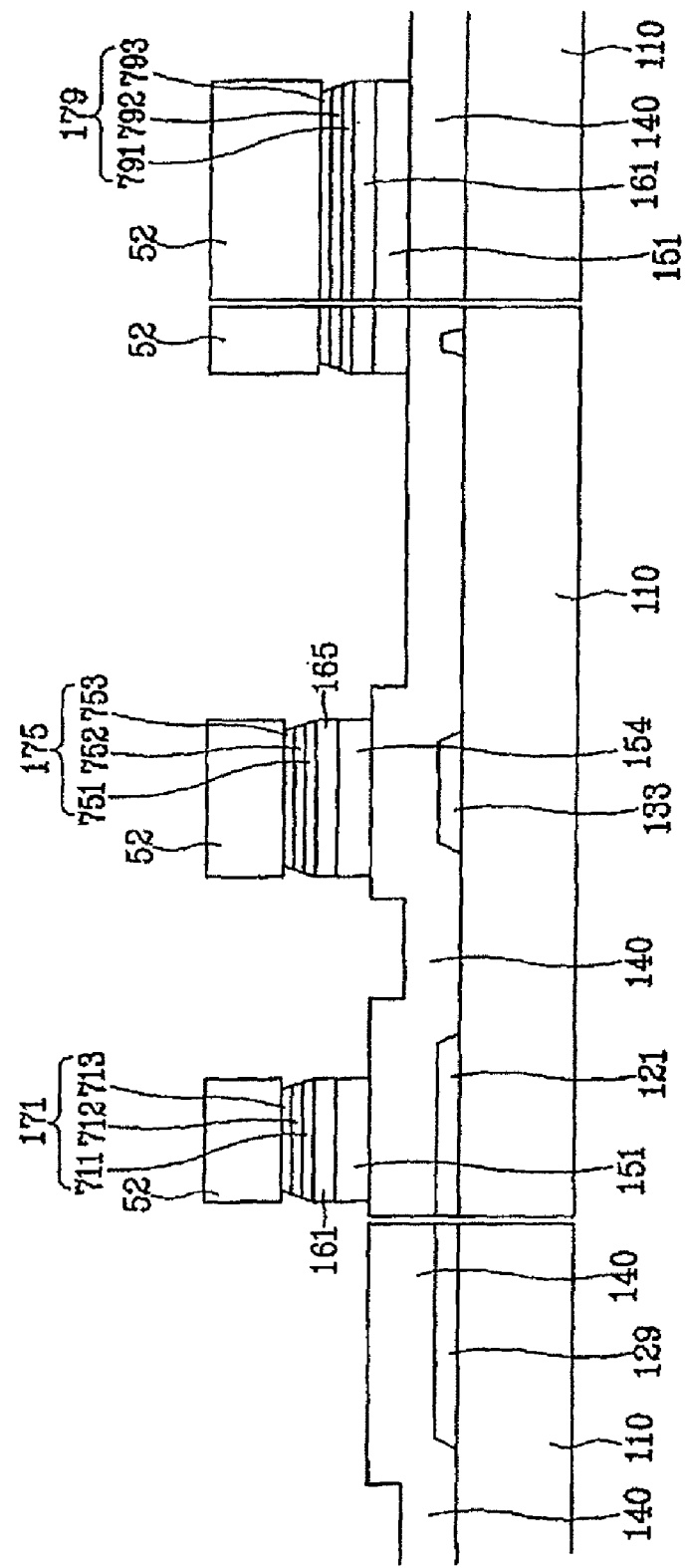
Figure 15B:
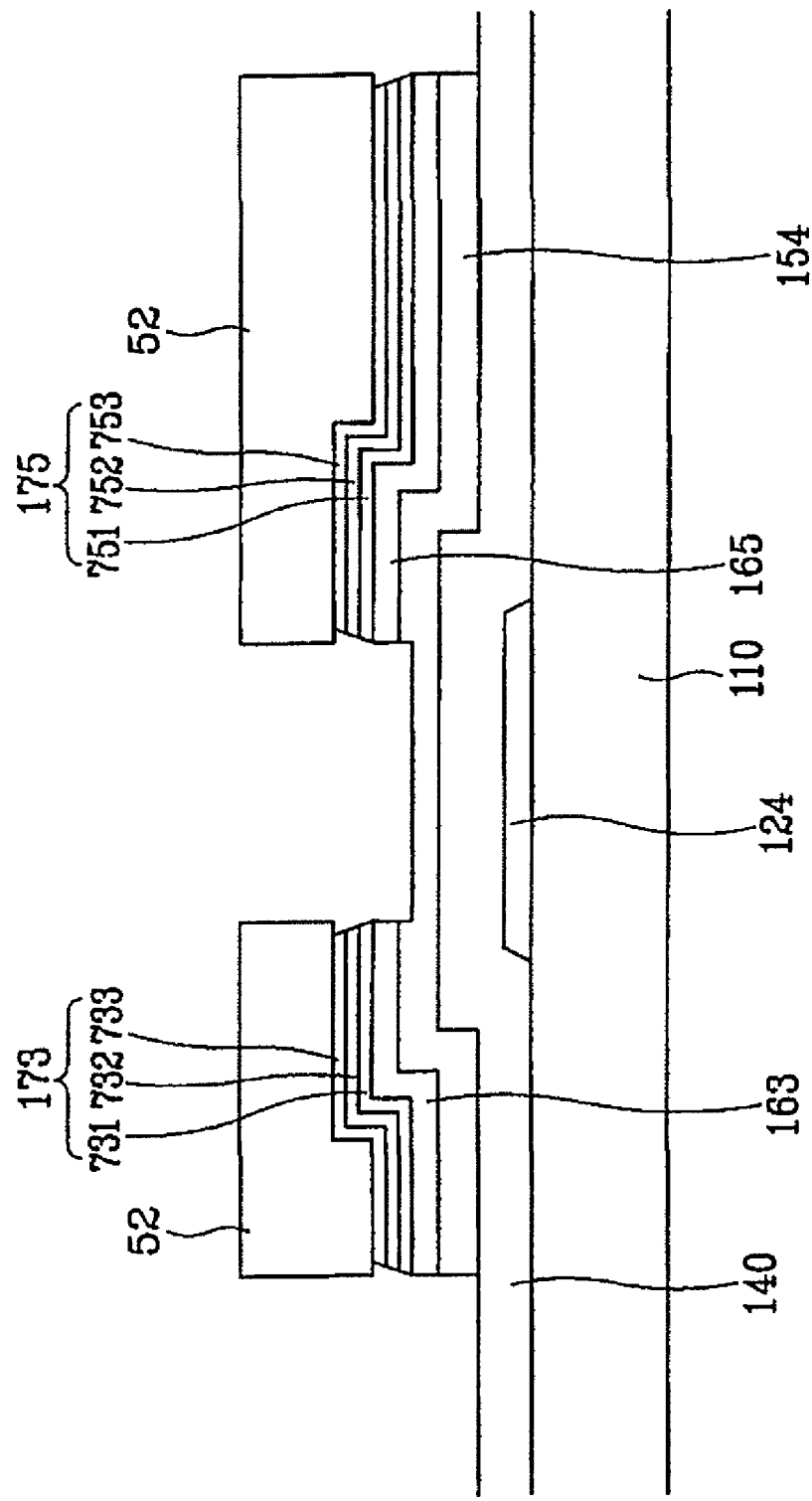
Figure 16A:
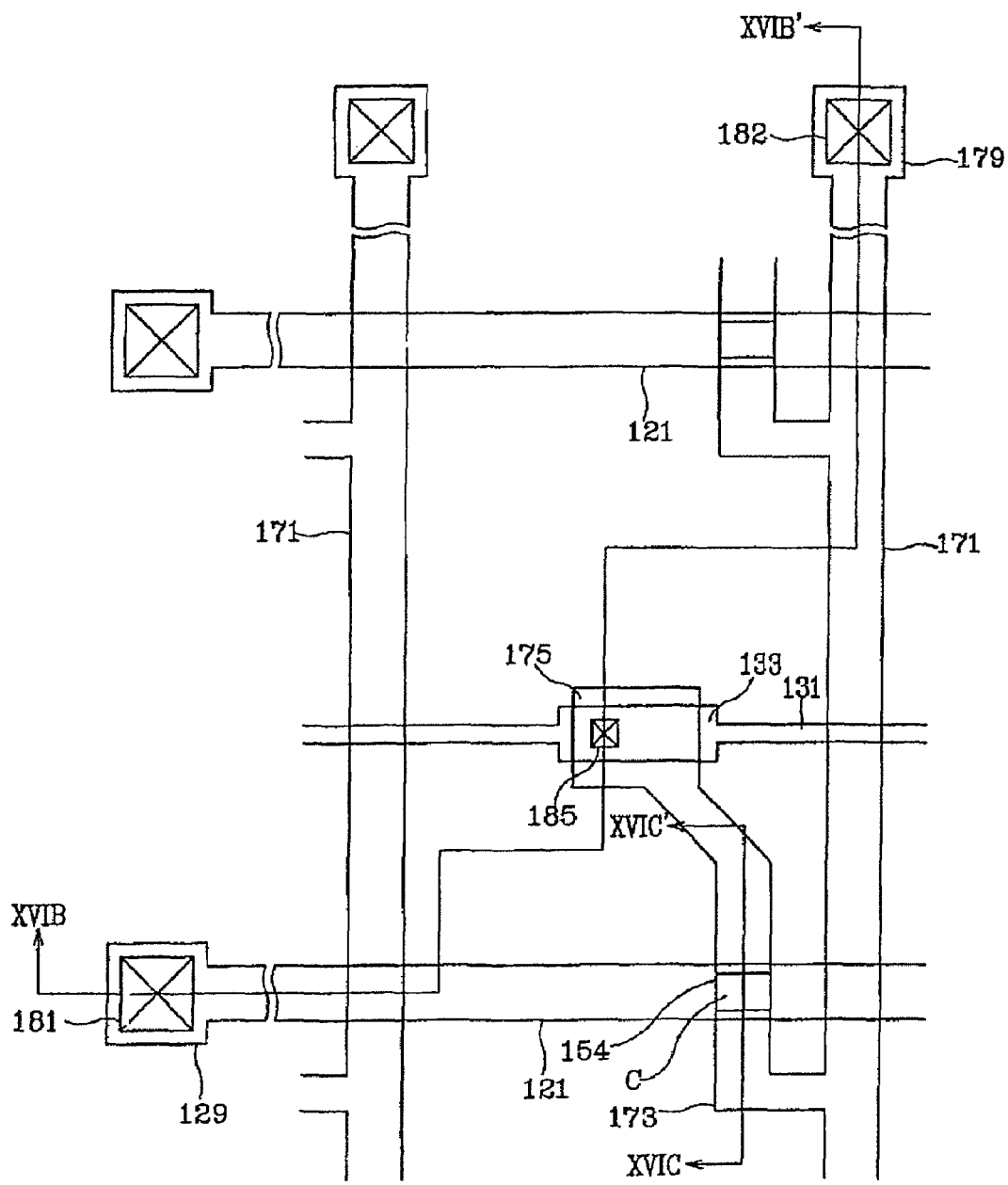
FIG. 16A is a layout view of a TFT array panel in the step following the step shown in FIGS. 15A and 15B.
Figure 16B:
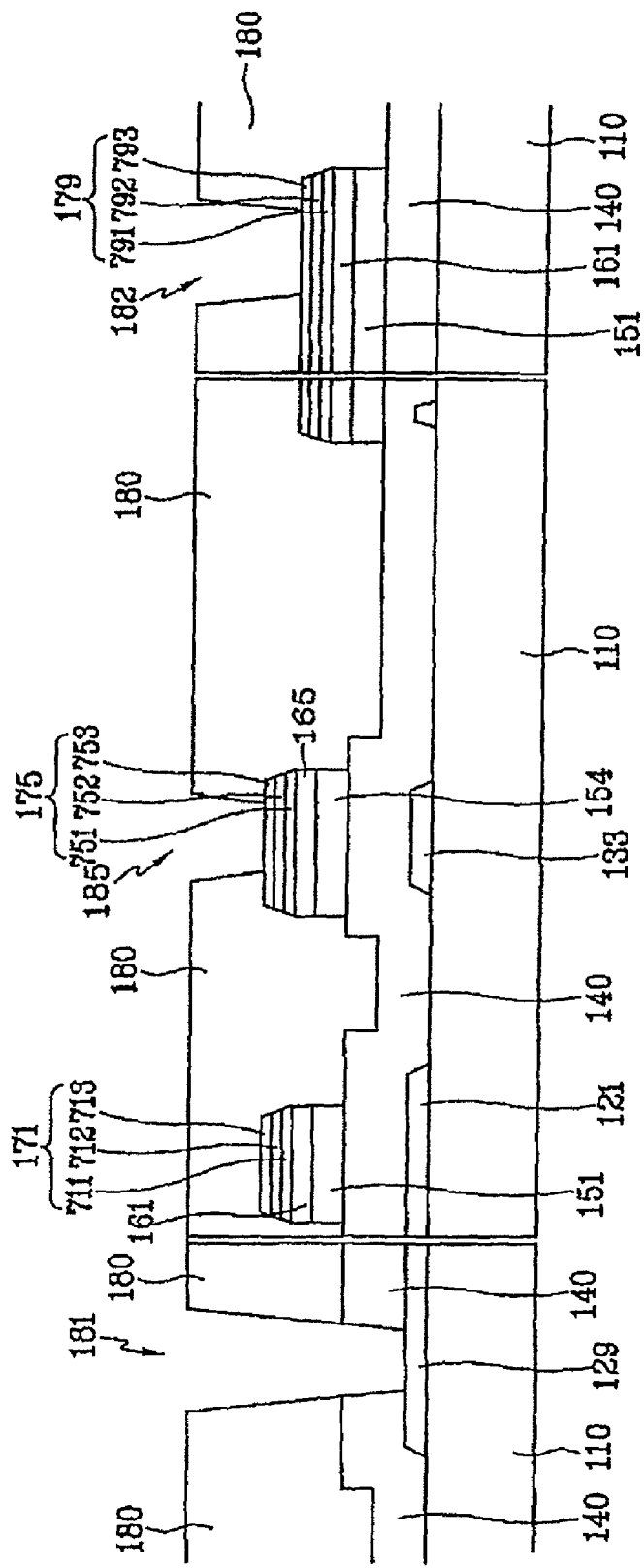
FIGS. 16B and 16C are sectional views of the TFT array panel shown in FIG. 16A taken along the lines XVIB-XVIB' and XVIC-XVIC', respectively.
Figure 16C:
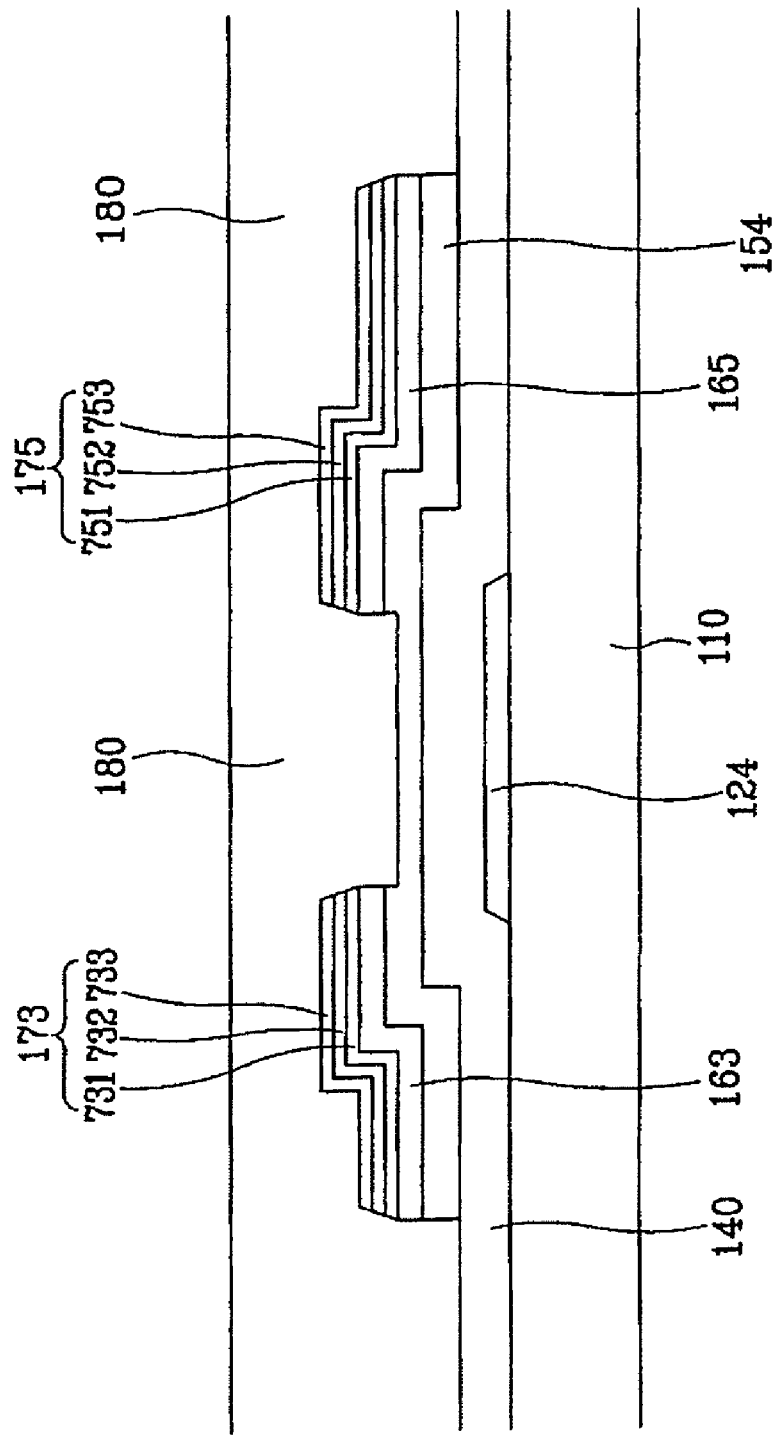

FIG. 10A is a layout view of a TFT array panel shown in FIGS. 7-9 in the first step of a manufacturing method thereof according to an embodiment of the present invention; FIGS. 10B and 10C are sectional views of the TFT array panel shown in FIG. 10A taken along the lines XB-XB' and XC-XC', respectively; FIGS. 11A and 11B are sectional views of the TFT array panel shown in FIG. 10A taken along the lines XB-XB' and XC-XC', respectively, and illustrate the step following the step shown in FIGS. 10B and 10C; FIG. 12A is a layout view of the TFT array panel in the step following the step shown in FIGS. 11A and 11B; FIGS. 12B and 12C are sectional views of the TFT array panel shown in FIG. 12A taken along the lines XIIB-XIIB' and XIIC-XIIC', respectively; FIGS. 13A, 14A and 15A and FIGS. 13B, 14B and 15B are sectional views of the TFT array panel shown in FIG. 12A taken along the lines XIIB-XIIB' and XIIC-XIIC', respectively, which illustrate the step following the step shown in FIGS. 10B and 10C; FIG. 16A is a layout view of a TFT array panel in the step following the step shown in FIGS. 15A and 15B; and FIGS. 16B and 16C are sectional views of the TFT array panel shown in FIG. 16A taken along the lines XVIB-XVIB' and XVIC-XVIC', respectively.

Referring to FIGS. 10A-10C, a plurality of gate lines 121 including a plurality of gate electrodes 124 and a plurality of storage electrode lines 131 including a plurality of storage electrodes 133 are formed on a substrate 110 by depositing and photo-etching a conductive film.

Referring to FIGS. 11A and 11B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-2,000 Å and about 300-600 Å, respectively. A conductive layer 170 including a lower film 701, an intermediate film 702, and an upper film 703 is deposited by sputtering, and a photoresist film 50 with the thickness of about 1-2 microns is coated on the conductive layer 170.

The photoresist film 50 is exposed to light through an exposure mask (not shown), and developed such that the developed photoresist has a position dependent thickness. The photoresist shown in FIGS. 12B and 12C includes a plurality of first to third portions with decreased thickness. The first portions located on wire areas A and the second portions located on channel areas C are indicated by reference numerals 52 and 54, respectively, and no reference numeral is assigned to the third portions located on remaining areas B since they have substantially zero thickness to expose underlying portions of the conductive layer 170. The thickness ratio of the second portions 54 to the first portions 52 is adjusted depending upon the process conditions in the subsequent process steps. It is preferable that the thickness of the second portions 54 is equal to or less than half of the thickness of the first portions 52, and in particular, equal to or less than 4,000 Å.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 52 and 54 enables to selectively etch the underlying layers when using suitable process conditions. Therefore, a plurality of data lines 171 including a plurality of source electrodes 173, and a plurality of drain electrodes 175, as well as a plurality of ohmic contact stripes 161 including a plurality of projections 163, a plurality of ohmic contact islands 165 and a plurality of semiconductor stripes 151 including a plurality of projections 154 are obtained as shown in FIGS. 12A, 15A and 15B by a series of etching steps.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas C are called second portions, and portions of the conductive layer 170, the extrinsic a-Si layer 160, and the intrinsic a-Si layer 150 on the remaining areas B are called third portions.

An exemplary sequence of forming such a structure is as follows:

(1) Removal of third portions of the conductive layer 170, the extrinsic a-Si layer 160 and the intrinsic a-Si layer 150 on the wire areas A;

(2) Removal of the second portions 54 of the photoresist;

(3) Removal of the second portions of the conductive layer 170 and the extrinsic a-Si layer 160 on the channel areas C; and (4) Removal of the first portions 52 of the photoresist.

Another exemplary sequence is as follows:

(1) Removal of the third portions of the conductive layer 170;

(2) Removal of the second portions 54 of the photoresist;

(3) Removal of the third portions of the extrinsic a-Si layer 160 and the intrinsic a-Si layer 150;

(4) Removal of the second portions of the conductive layer 170;

(5) Removal of the first portions 52 of the photoresist; and (6) Removal of the second portions of the extrinsic a-Si layer 160.

The first example is described in detail.

Figure 13A:
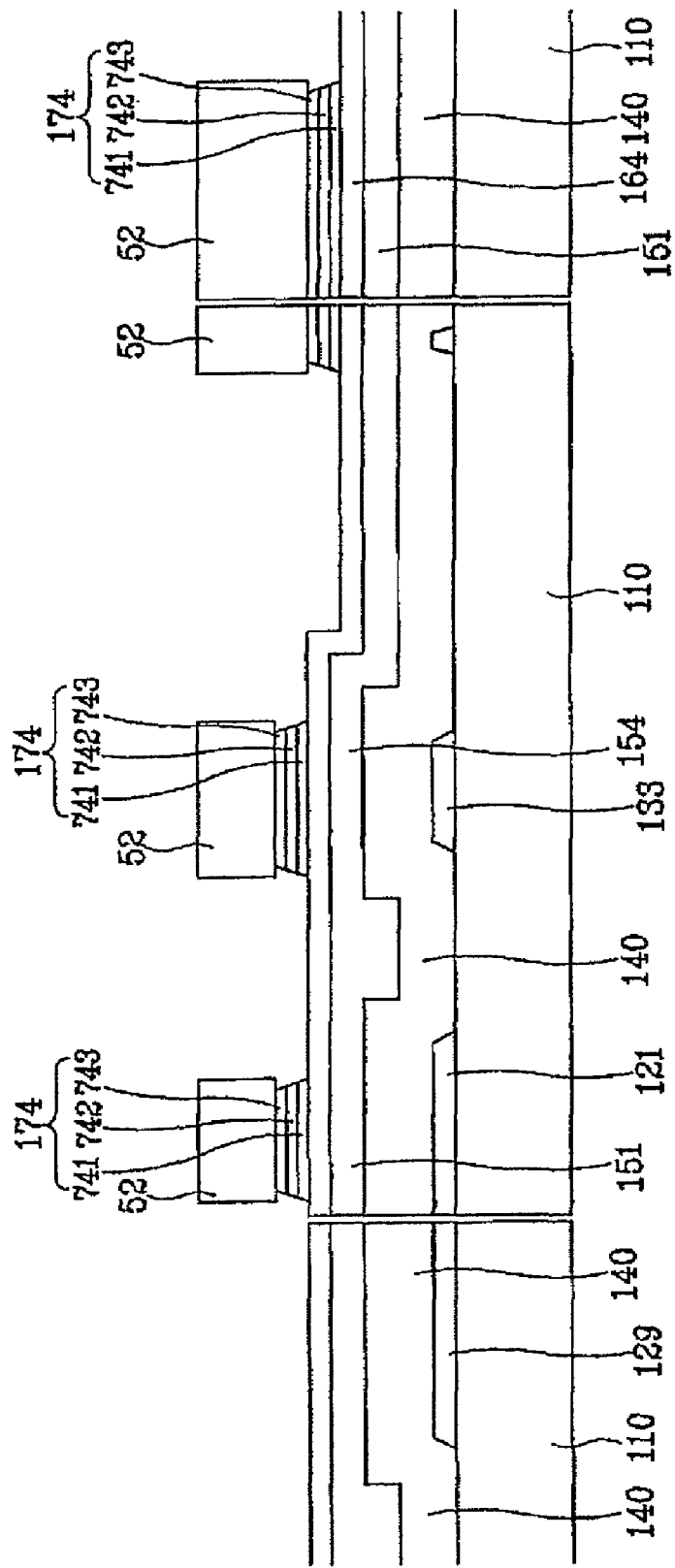
Figure 13B:
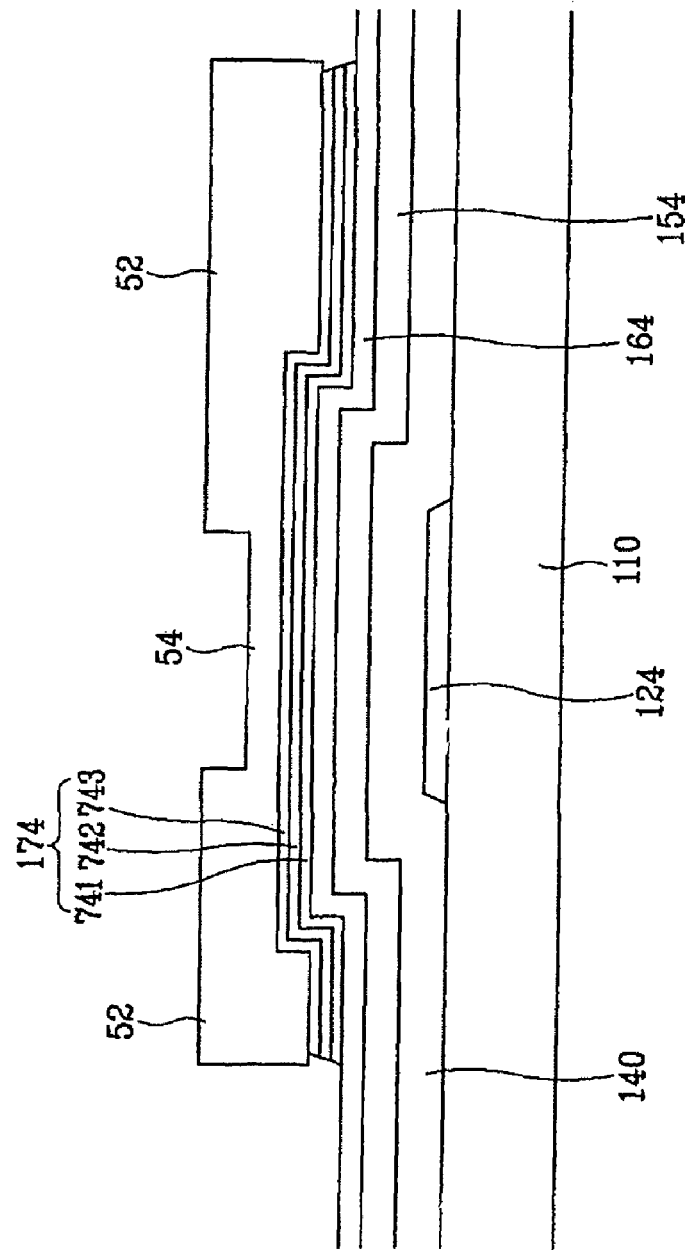

Referring to FIGS. 13A and 13B, the exposed third portions of the conductive layer 170 on the remaining areas B are removed by wet etching or dry etching to expose the underlying third portions of the extrinsic a-Si layer 160. The Al containing metal film 702 is preferably wet etched, while the Mo containing metal films 701 and 703 can be etched both by dry etch and wet etch. The lower, intermediate and upper films 701, 702 and 703 may be simultaneously etched under the same etching condition.

Reference numeral 174 indicates portions of the conductive layer 170 including the data lines 171 and the drain electrode 175 connected to each other and lower and upper films thereof is indicated by 741 and 742, respectively. The dry etching may etch out the top portions of the photoresist 52 and 54.

Figure 14A:
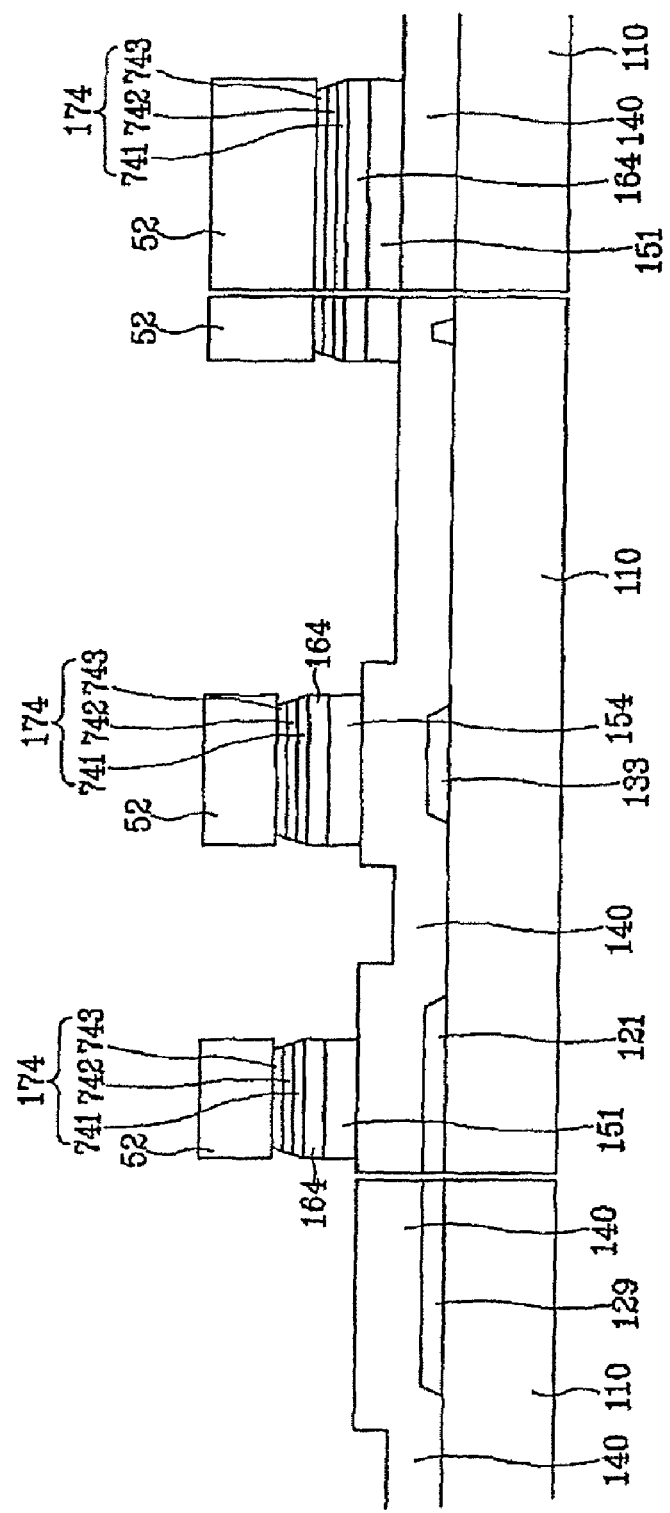

Referring to FIGS. 14A and 14B, the third portions of the extrinsic a-Si layer 160 on the areas B and of the intrinsic a-Si layer 150 are removed preferably by dry etching and the second portions 54 of the photoresist are removed to expose the second portions of the conductors 174. The removal of the second portions 54 of the photoresist are performed either simultaneously with or independent from the removal of the third portions of the extrinsic a-Si layer 160 and of the intrinsic a-Si layer 150. Residue of the second portions 54 of the photoresist remained on the channel areas C is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

The lower film 701 of the conductive layer 170, the extrinsic a-Si layer 160, and the intrinsic a-Si layer 150 are dry-etched in sequence to simplify the manufacturing process. In this case, the dry etching of the three film and layers 701, 160 and 150 may be performed in-situ in a single etching chamber.

Referring to FIGS. 15A and 15B, the second portions of the conductors 174 and is the extrinsic a-Si stripes 164 on the channel areas C as well as the first portion 52 of the photoresist are removed.

In case that the exposed portions of the extrinsic semiconductor stripes 164 is removed using the data lines 171, the drain electrodes 175, and the storage capacitor conductors 177 as an etch mask after removing the photoresist film, the Mo containing films are preferably oxidized to form an oxide film (not shown) thereon having a small thickness of about 10-20□ in order to prevent the damage on the Mo containing films of the data lines 171, etc.

As shown in FIG. 15B, top portions of the projections 154 of the intrinsic semiconductor stripes 151 on the channel areas C may be removed to cause thickness reduction, and the first portions 52 of the photoresist are etched to a predetermined thickness.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

Referring to FIGS. 16A-16C, a passivation layer 180 is formed by the CVD of a silicon nitride film under a temperature of about 250-1,500° C., by the coating of an acrylic organic insulating film, or by the PECVD of low dielectric insulating material such as a-Si:C:O and a-Si:O:F having dielectric constant lower than about 4.0. Thereafter, the passivation layer 180 and the gate insulating layer 140 are photo-etched to form a plurality of contact holes 181, 182 and 185.

Finally, as shown in FIGS. 7-9, a plurality of pixel electrodes 190 and a plurality of contact assistants 81 and 82 are formed on the color filter stripes 230R, 230G and 230B by sputtering and photo-etching an ITO or IZO layer. The etching of the IZO film may include wet etching using a Cr etchant such as $HNO_3/(NH_4)_2Ce(NO_3)_6/H_2O$, which does not erode the is exposed Al portions of the gate lines 121, the data lines 171, and the drain electrodes 175 through the contact holes 182, 183 and 185.

Since the manufacturing method of the TFT array panel according to an embodiment simultaneously forms the data lines 171, the drain electrodes 175, the semiconductors 151, and the ohmic contacts 161 and 165 using one photolithography process, the manufacturing process is simplified by omitting a photolithography step.

The above-described TFT array panels may further include a plurality of color filters.

As described above, the methods of manufacturing a TFT array panel according to the embodiments of the present invention prevents the etch out of the Mo containing film by oxidizing the Mo containing film, thereby preventing the deterioration of the characteristics of the TFTs.

While the present invention has been described in detail with reference to the preferred embodiments, those skilled in the art will appreciate that various modifications and substitutions can be made thereto without departing from the spirit and scope of the present invention as set forth in the appended claims.

The invention claimed is:

1. A method of manufacturing a thin film array panel, the method comprising:
    forming a gate line formed on a substrate;
    forming a gate insulating layer on the gate line;
    forming a semiconductor layer on the gate insulating layer;
    forming an ohmic contact layer on the semiconductor layer;
    forming a data line including a source electrode and a drain electrode disposed at least on the ohmic contact layer;
    forming an oxide film on the data line and the drain electrode;
    etching the ohmic contact layer using the source electrode and the drain electrode as an etch mask; and
    forming a pixel electrode connected to the drain electrode, wherein the oxide film has the same pattern as the data line and the drain electrode.

2. The method of claim 1, wherein the formation of the oxide film comprises:
    performing oxygen plasma treatment on the data line and the drain electrode.

3. The method of claim 2, wherein the oxygen plasma treatment is performed for a time longer than about fifteen seconds.

4. The method of claim 1, wherein the data line and the drain electrode comprise a first film of Mo or Mo alloy.

5. The method of claim 4, wherein the data line and the drain electrode further comprise a second film of Al or Al alloy.

6. The method of claim 1, further comprising:
    performing ashing after the formation of the oxide film.

7. The method of claim 1, wherein the formation of the oxide film comprises:
    exposing the data line and the drain electrode to air.

8. The method of claim 1, wherein the pixel electrode comprises ITO or IZO.

9. The method of claim 1, wherein the ohmic contact layer comprises extrinsic amorphous silicon.

10. The method of claim 1, wherein the semiconductor layer, the ohmic contact layer, and the drain electrode and the data line are formed by using a single photoresist pattern.

11. The method of claim 1, wherein
    coverage of the oxide film does not extend beyond the data line and the drain electrode.

12. The method of claim 1, further comprising forming a passivation layer on the data line and the drain electrode,
    wherein the oxide film is disposed between the passivation layer and all of the data line and the drain electrode.

13. The method of claim 1, wherein the oxide film comprises molybdenum oxide.

* * * * *